United States Patent
Komatsu

(10) Patent No.: US 7,268,578 B2
(45) Date of Patent: Sep. 11, 2007

(54) TRANSMISSION CIRCUIT, DATA-TRANSFER CONTROL DEVICE AND ELECTRONIC EQUIPMENT

(75) Inventor: Fumikazu Komatsu, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 8 days.

(21) Appl. No.: 11/132,385

(22) Filed: May 19, 2005

(65) Prior Publication Data
US 2005/0258868 A1 Nov. 24, 2005

(30) Foreign Application Priority Data
May 24, 2004 (JP) .............................. 2004-153655

(51) Int. Cl.
*H03K 17/16* (2006.01)
(52) U.S. Cl. .......................... 326/27; 326/83
(58) Field of Classification Search ............ 326/82–87, 326/26, 27
See application file for complete search history.

(56) References Cited

U.S. PATENT DOCUMENTS

| 5,371,420 A * | 12/1994 | Nakao ........................... 326/27 |
| 6,664,804 B2 | 12/2003 | Nakada et al. |
| 6,762,619 B2 | 7/2004 | Nakada et al. |
| 2005/0057274 A1* | 3/2005 | Groen et al. ................... 326/27 |
| 2006/0097753 A1* | 5/2006 | Shibata et al. ................. 326/83 |

FOREIGN PATENT DOCUMENTS

| JP | A 2002-344542 | 11/2002 |
| JP | A 2002-344543 | 11/2002 |

* cited by examiner

*Primary Examiner*—Don Le
(74) *Attorney, Agent, or Firm*—Oliff & Berridge, PLC

(57) ABSTRACT

Providing a transmission circuit, which can transfer data normally with high speed even toward a host controller and a device, which does not meet design requirements defined in the standard, a data-transfer control device and electronic equipment. A current source coupled between a first source VDD and a node ND10; a first transistor SW1 formed between the node ND10 and a DP terminal; a second transistor SW2 formed between the node ND10 and a DM terminal; a first buffers outputting a first control signal HS_DPout 2 to the gate of the first transistor SW1; and a second buffer outputting a second control signal HS_DMout 2 to the gate of the second transistor SW2; are included. When any of the first control signal HS_DPout2 and the second control signal HS_Dmout 2 is set active, other of the control signals is set non-active. Each of the buffers includes a first inverter INV1 and a second inverter INV receiving an output from the first inverter INV1. A capacitance-arrangement circuit between the inverters INV1 and INV2 is installed.

22 Claims, 24 Drawing Sheets

TRANSMISSION CIRCUIT, DATA-TRANSFER CONTROL DEVICE AND ELECTRONIC EQUIPMENT

BACKGROUND

The present invention relates to a transmission circuit, a data-transfer control device and electronic equipment.

In data transmission control using deferential signals, the universal serial bus (USB) standard is known as an interface standard for connecting a personal computer with peripheral devices. The demand for high-speed data transmission is increased in recent years. Products spread among people corresponding to the high speed newly defined in USB 2.0 and in capable of transmitting data with the speed faster than Low Speed, Full Speed defined in USB 1.1. Various methods and means have been devised for transferring data normally in data-transfer control devices corresponding to USB 2.0 standard (see the patent document).

Regarding Low Sped and Full Speed defined in USB 1.1 standard and USB 2.0 standard, a host controller had frequently received data normally even not corresponding to the standards since data transfer rate was low. Hence, there have been few problems in data transfer even in products which were not strictly corresponding to designing requirements regulated as Low Speed and Full Speed defined in USB 1.1 standard and USB 2.0 standard.

High Speed newly defined in USB 2.0 has, however, an extremely high data transmission rate such as 480 Mbps. The high rate sometime causes a receiving circuit in a host controller not to transfer transmitted wave signals, which are corresponding to the standard, if the circuit does not satisfy designing requirements defined by USB 2.0. Namely, some products in the market do not strictly meet designing requirements defined by USB2.0.

When a host controller receiving data does not meet designing requirements defined in the standard for example, the controller frequently does not transfer data normally even if a device controller transmitting data meet these designing requirements and transmits signals of which waveform is corresponding to the standard. Similarly, when a device controller receiving data does not meet designing requirements defined in the standard, the controller frequently does not transfer data normally even if a host controller transmitting data complies with these designing requirements and transmits signals of which waveform is corresponding to the standard.

[Patent Document 1] Unexamined patent publication 2002-344542.

In view of the above issues and overcoming them, the present invention is to provide a transmission circuit, which can transfer data normally with high speed even toward a host controller and a device, which does not meet design requirements defined in the standard, data-transfer control device and electronic equipment.

SUMMARY

The present invention is a transmission circuit transmitting deferential signals via a first and a second signal lines constituting a differential pair, that comprises:
a current source coupled between a first source and a given node;
a first transistor formed between the first signal line and the node;
a second transistor formed between the second signal line and the node;
a first buffer outputting a first control signal to the gate of the first transistor; and
a second buffer outputting a second control signal to the gate of the second transistor.

Each of the first and second buffers includes a first inverter and a second inverter receiving an output from the first inverter; and
a capacitance-arrangement circuit is installed between the first inverter and the second inverter.

According to the invention, waveform of the output signal from the transmission circuit can be adjusted, transferring data, which uses differential signals, accurately even if receiving circuits in a host controller or a device controller do not strictly meet the given standard.

Further, the capacitance-arrangement circuit of the present invention may include at least a second switch controlled by a switching signal and at least a second capacitive element. One end of the first switching element may be coupled to the output node of the first inverter and other end of the switching element may be coupled to the end of the first capacitive element. Therefore, the capacitance-arrangement circuit can adjust a wiring capacitance of the output node of the first inverter thereby.

Further, the first switching element of the invention may comprise a transistor;
the first capacitive element may comprise a N type MOS transistor;
the drain of the transistor may be coupled to the output node of the first inverter;
the source of the transistor may be coupled to the gate of N type MOS transistor; and
the source and drain of the N type MOS transistor may be coupled to the second power source.

In the invention, a plurality of first switching elements and a plurality of capacitive elements may be installed between the output node of the first inverter and the second power source;
one end of each of a planarity of first switching elements may be coupled to the output node of the of the first inverter;
and the other end of each of a plurality of the first switching elements may be coupled to one end of each of a plurality of the first capacitive elements.

Therefore, the capacitance-arrangement circuit can adjust a wiring capacitance of the output node of the first inverter with more multiple steps thereby.

Further, the capacitance-arrangement circuit of the present invention may include at least a second switch controlled by a switching signal and at least a second capacitive element. One end of the second switching element may be coupled to the output node of the first inverter and other end of the second switching element may be coupled to the end of the second capacitive element; and the other end of the second capacitive element may be coupled to the first power source.

Therefore, the capacitance-arrangement circuit can adjust a wiring capacitance of the output node of the first inverter with fine accuracy thereby.

Further, the second switching element of the invention may comprise a transistor;
the second capacitive element may comprise a P type MOS transistor;
the drain of the transistor may be coupled to the output node of the first inverter;
the source of the transistor may be coupled to the gate of the P type MOS transistor; and
the source and drain of the P type MOS transistor may be coupled to the first power source.

Further, in the invention, a plurality of second switching elements and a plurality of second capacitive elements may be installed between the output node of the first inverter and the first power source;

one end of each of a plurality of second switching elements may be coupled to the output node of the of the first inverter; and the other end of each of a plurality of the second switching elements may be coupled to one end of each of a plurality of the second capacitive elements.

Therefore, the capacitance-arrangement circuit can adjust a wiring capacitance of the output node of the first inverter with more multiple steps thereby.

Further, the capacitance-arrangement circuit of the invention may include a plurality of first and second switching elements controlled by a switching signal and a plurality of first and second capacitive elements. One end of each of a plurality of the first and second switching elements may be coupled to the output node of the first inverter;

the other end of each of a plurality of the first switching elements may be coupled to one end of each of a plurality of the first capacitive elements and the other end of each of a plurality of the first switching elements may be coupled to one end of each of a plurality of the first capacitive elements.

The present invention is a transmission circuit transmitting deferential signals via a first and a second signal lines constituting a differential pair, that comprises:

a current source coupled between a first source and a given node;

a first transistor formed between the first signal line and the node;

a second transistor formed between the second signal line and the node;

a first buffer outputting a first control signal to the gate of the first transistor;

a second buffer outputting a second control signal to the gate of the second transistor;

an enable signal generation circuit generating at least one of enable signals, which output to the first and second buffer circuits. Each of the first and second buffers includes a first inverter and a second inverter receiving an output from the first inverter. At least of a plurality of the second inverters is an inverter provided with a terminal for receiving the enable signal and enabled or disabled based on an enable signal from the enable signal generation circuit and the each output of a plurality of the second inverters is commonly coupled to other output.

Further, in the invention, the ratio of current drive capability of a P type transistor and current drive capability of N type transistor constituting each of a planarity of the second inverters may be identical among a planarity of the second inverters.

The feature can make the difference between the rising of the output waveform and the falling of it small in the buffer. Further, it can make the potential at a cross-point, in which the first control signal wave crosses the second control signal wave, keep constant in spite of numbers of the second inverters, which are set enabled.

Further, a plurality of the second inverters of the invention may be an inverter provided with an enable terminal. The enable signal generation circuit may select any of the second inverters by outputting enable signal to any of the second inverters of the plurality of the second inverters, so as to arrange total current drive capabilities of the plurality of the second inverters depending on the numbers of the selected second inverters.

The present invention is a transmission circuit transmitting deferential signals via a first and a second signal lines constituting a differential pair that comprises:

a current source coupled between a first source and a given node;

a first transistor formed between the first signal line and the node;

a second transistor formed between the second signal line and the node;

a first buffer outputting a first control signal to the gate of the first transistor; and a second buffer outputting a second control signal to the gate of the second transistor.

The first buffer includes a first control-signal arrangement circuit that arranges rising time ad falling time of the first control signal; and the second buffer includes a second control-signal arrangement circuit that arranges rising time and falling time of the second control signal. Further, in the invention, the first buffer includes a first inverter and a second inverter receiving an output from the first inverter;

the first control-signal arrangement circuit arranges a signal input to the second inverter from the first inverter so as to arrange rising time and falling time of the first control signal;

the second buffer includes a third inverter and a fourth inverter receiving an output from the third inverter; and the second control-signal arrangement circuit arranges a signal input to the fourth inverter from the third inverter so as to arrange rising time and falling time of the second control signal;

Further, in the invention, a deferential signal transmitted via a first and a second signal lines constituting a differential pair, may be a signal regulated by the universal serial bus (USB) standard.

The invention relates to a data-transfer control device comprises a circuit processing given signal transmission and any of the above transmission circuit transmitting a signal based on the signal transmission processing The data-transfer control device of the present invention may include: a capacitance arrangement register for storing capacitance-arrangement information to control the capacitance-arrangement circuit.

Therefore, setting the capacitive arrangement circuit can be controlled by a firmware and the like.

Further, the data-transfer control device of the present invention may include:

a drive-capability arrangement register for storing enable and disable information to control enable and disable status of the plurality of the second inverter.

Therefore, setting the enable signal generation circuit can be controlled by a firmware and the like.

The invention relates electronic equipment includes any of the above data-transfer control circuits and a unit for processing memorization, importing, exporting data transferred via the data transmission control circuit and a bus.

DETAILED DESCRIPTION OF EMBODIMENTS

The preferred embodiments of the invention are explained referring with figures. It should be noted that the present embodiment below is not intended to unreasonably limit the scope of the invention as set out in the appended claims. Also, the present invention may be practiced without some of the specific elements described below.

1. Transmission Circuit

Figure 1:
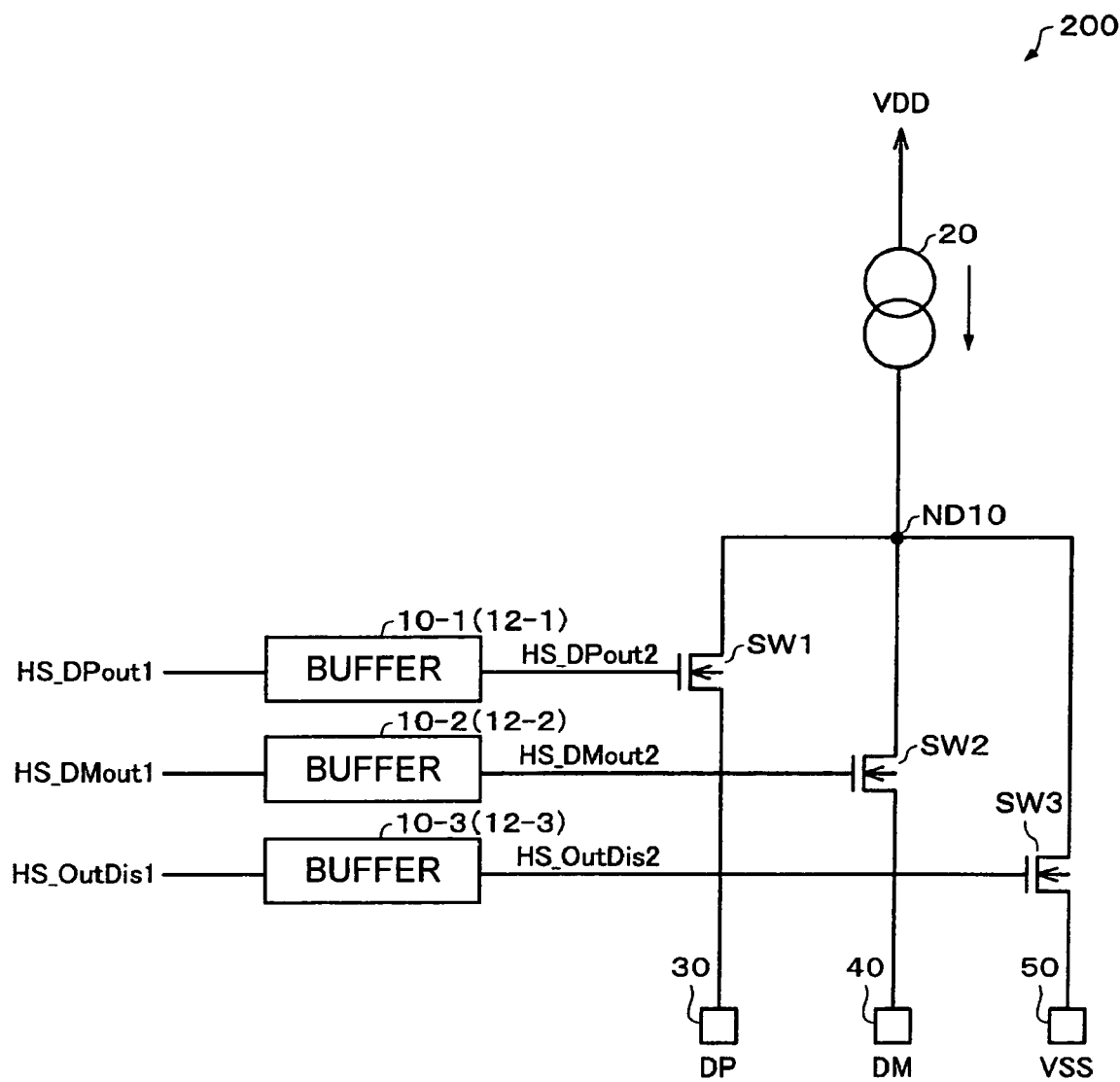
FIG. 1 is a circuit diagram of a transmission circuit of a first and second embodiments.

FIG. 1 shows a transmission circuit 200 transmitting deferential signals via a first and a second signal lines constituting a differential pair. Referring to the drawings, like numerals indicate like elements throughout the views. Further, a vertical axis indicates voltage and a longitudinal axis indicates time in all drawings including waveforms.

The transmission circuit 200 can transmit the differential signal, which corresponds to the interface standard such as the USB standard for transferring data using differential signal. When the transmission circuit 200 transmits differential signals, the first signal line is connected to a DP terminal 30 and the second signal line is connected to a DM terminal 40.

The transmission circuit 200 includes the first power source VDD (generating 3.3 V, for example), a constant current source 20 connected to a node ND20 (a given node in the broad sense), a transistor SW1 of which end is connected to a node ND10 (a first transistor in the broad sense), a transistor SW2(a second transistor in the broad sense) and a transistor SW3. The other end of the transistor SW1 is connected to the DP terminal 30 and the other end of the transistor SW2 is connected to the DM terminal 40 and the other end of the transistor SW3 is connected to the VSS terminal 50. Here, the VSS terminal is connected to the second power source VSS (not shown and generating ground level for example), which is lower than the first power source VDD. Further, the transmission circuit 200 includes a buffer 10-1(a first buffer in the broader sense, a first control-signal arrangement circuit in the further broader sense) connected to the gate of the transistor SW1, a buffer 10-2(a second buffer in the broader sense, a first control signal adjustment circuit) connected to the gate of the transistor SW2, and a buffer 10-3 connected to the gate of the transistor SW3. But, the transmission circuit 200 is not limited to the above constitution. The buffers 10-3 connected the VSS terminal and the gate of the transistor SW3 may be omitted for example. Here, the transistor SW3 is held as an OFF state during outputting differential signal from the transmission circuit 200. The buffers 10-1 to 10-3 are called as the buffers 10 hereafter as a generic term.

Each of the buffers 10 receives the signals HS_DPout1, HS_DMout1, and HS_DoutDis1 and outputs the signals; HS_DPout2(the first control signal in the broader sense), HS_DMout2 (the second control signal in the broader sense) and HS_OUTdis2 to the gate of each of transistors SW1 to SW3. Here, at the time of data transferring, the signal HS_DPout1 and HS_DMout1 are input as inversing signal. Thus, the signal HS_DMout1 is set non-active when the signal HS_DPout1 is set active and the signal HS_DMout1 is set active when HS_DPout1 is set non-active. Further, the signals, HS_DPout1 and HS_DMout1 are output to the gate of each of transistors, SW1 and SW2, setting the signal HS_DMout2 to be non-active, when the signal HS_DPout 2 is set active and vice versa.

The signals, HS_DPout1 and HS_DMout1, of which active and non-active states are controlled exclusively, are output to the gate of each of transistors SW1 and SW2 via each of buffers 10 as the signals HS_DPout 2 and HS_D-Mout 2. When HS_DPout2 is active for example, HS_D-Mout2 is set non-active, making the transistor SW1 an ON state and the transistor SW2 an OFF state. Thus, the DP terminal 30 is electrically connected to the constant current source 20 thereby.

On the other hand, when HS_DPout2 is non-active, HS_DMout2 is set active, making the transistor SW1 an OFF state and the transistor SW2 an ON state. Thus, the DM terminal 40 is electrically connected to the constant current source 20 thereby.

Thus, the transistors SW1 and SW2 are exclusively controlled, managing an amount of current flowing in the DP terminal 30 and the DM terminal 40 so as to generate the differential signal at the DP terminal 30 and the DM terminal via end resistors.

2. Buffer

Buffers are explained hereafter.

2.1 First Embodiment

Figure 2:
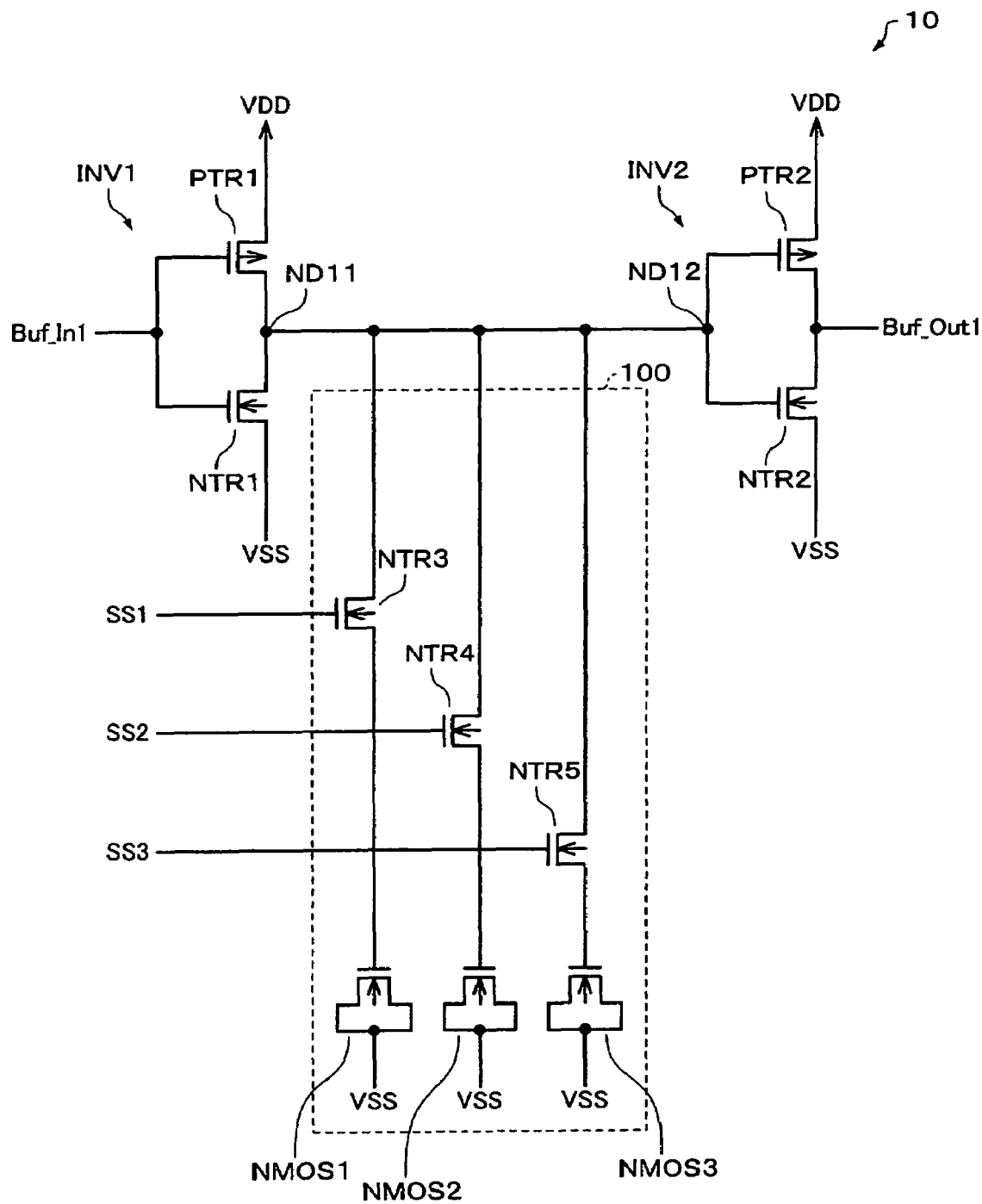
FIG. 2 is a circuit diagram showing a buffer of the first embodiment.

In the present embodiment, buffers 10 are installed in the transmission circuit 200. FIG. 2 shows a detail circuitry of the buffers 10. The buffers 10 include an inverter INV1 (a first inverter in the broad sense), an second inverter INV2 (a second inverter in the broad sense) and a capacitance-arrangement circuit 100. An output node ND11 of the inverter INV1 is connected to an input node ND12 of the inverter INV2. A capacitance-arrangement circuit 100 is installed between the inverter IV1 and the inverter INV2. Here, an output Buf_Out1 of the inverter INV2 (the second inverter in the broad sense) is the output of the buffers 10.

The capacitance-arrangement circuit 100 includes transistors NTR3 to NTR5 (a first switching element in the broad sense) and capacitive elements NMOS1 to NMOS3 (a first capacitive element in the broader sense). End of each of transistors NTR3 to NTR5 is connected to a line between the output node ND11 of the inverter INV1 and the input node ND12 of the inverter INV2. Other end of each of transistors NTR3 to NTR5 is connected to each of capacitive elements NMOS1 to NMOS3. In the present embodiment, each of capacitive elements NMOS1 to NMOS3 comprises a NMOS transistor, but not limited to such transistor. Each of each of capacitive elements NMOS1 to NMOS3 may comprise a first and second polysilicon thin films.

In the present embodiment, other end of each of transistors NTR3 to NTR5 is connected to the gate of each of capacitive elements NMOS1 to NMOS3 and the source and drain thereof is connected to the second power source VSS. Each of switching signals SS1 to SS3 is input to the gate of each of transistors NTR3 to NTR5.

When at least any one of switching signals SS1 to SS3 is set active, transistors among transistors NTR3 to NTR5, which receive switching signals set active, are turned to ON state. Thus, capacitive elements among capacitive elements NMOS1 to NMOS3, which are connected to the ON state transistors, are turned to be connected to a lines between the node ND11 and node ND12 thereby. This connection increases wiring capacitance of the output node ND11 of the inverter INV1 (or the input node ND12 of the inverter ND12). Namely, controlling each of switching signals SS1 to SS3 can adjust the value of the wiring capacitance of the node ND11 (or node ND12) with multiple steps.

Here, in the capacitance-arrangement circuit 100 of the present embodiment, three transistors NTR3 to NTR5 and three capacitive elements NMOS1 to NMOS3 are installed. The circuit is not limited to this setup, but two or four transistors and capacitive elements may be installed. Setting more than four transistors (a first switching element in the broader sense) and capacitive elements (a first capacitive element in the broader sense) can make setting additional capacitance further multiple steps.

The value of the wiring capacitance of the output node ND11 in the inverter INV1 (or the input node ND12 of the inverter INV2) is adjusted so as to adjust signal waveform Buf_Out1, the output from the inverter INV2, namely the output of the buffers 10. Here, the signal output from the output Buf_Out1 of the buffers 10 is the signal HS_DPout2 or HS_DMout2, which is input to the gate of the transistor SW1 or SW2 of the transmission circuit 200 in FIG. 1. Namely, the waveforms of the signals HS_DPout2 and HS_DMout2, which control the transistors SW1 and SW2, can be adjusted so as to adjust the waveform of the differential signals outputting from the DP terminal 30 and the DM terminal 40.

Next, the operation of the buffers 10 is explained referring with FIG. 2 and FIG. 3A to C.

Figure 3A:
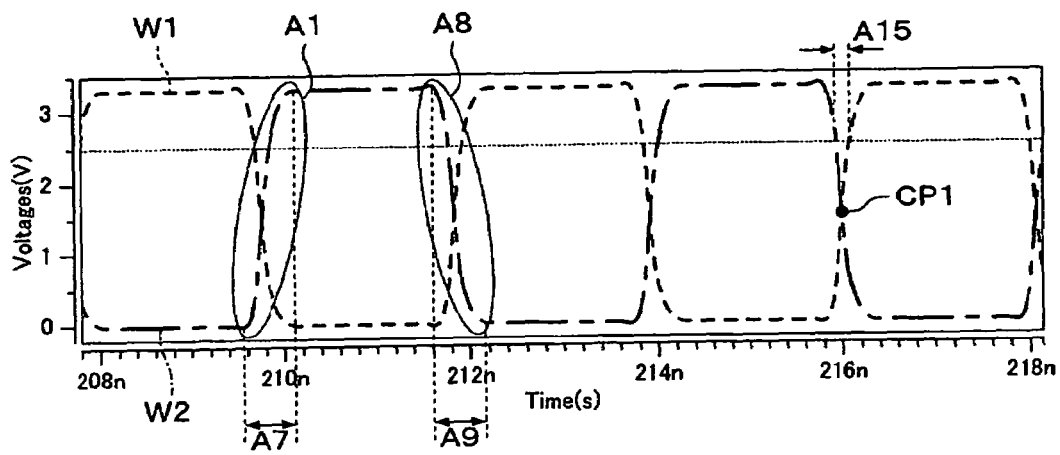
FIGS. 3A to 3C show signal waveforms inputting the buffer of the first embodiment and outputting a line between a first and second inverters and a buffer.
Figure 3B:
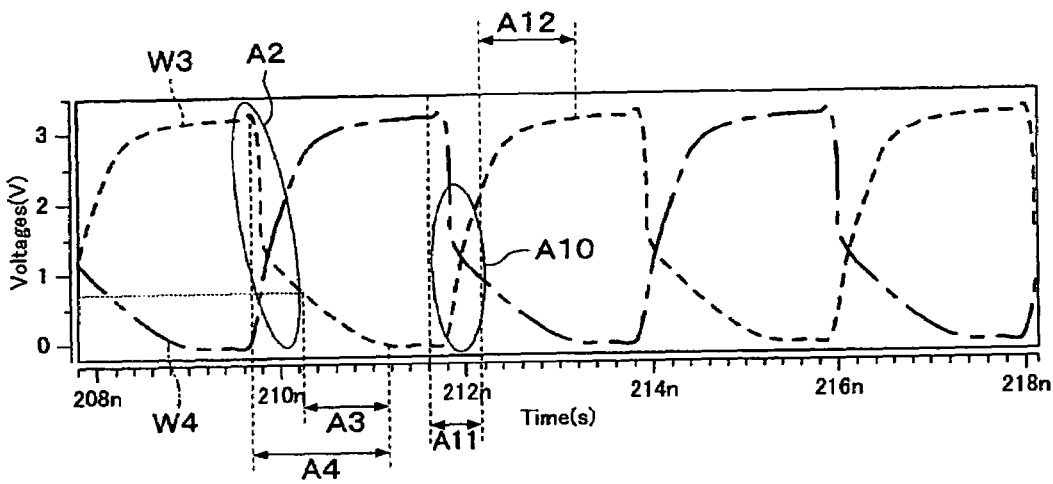
Figure 3C:
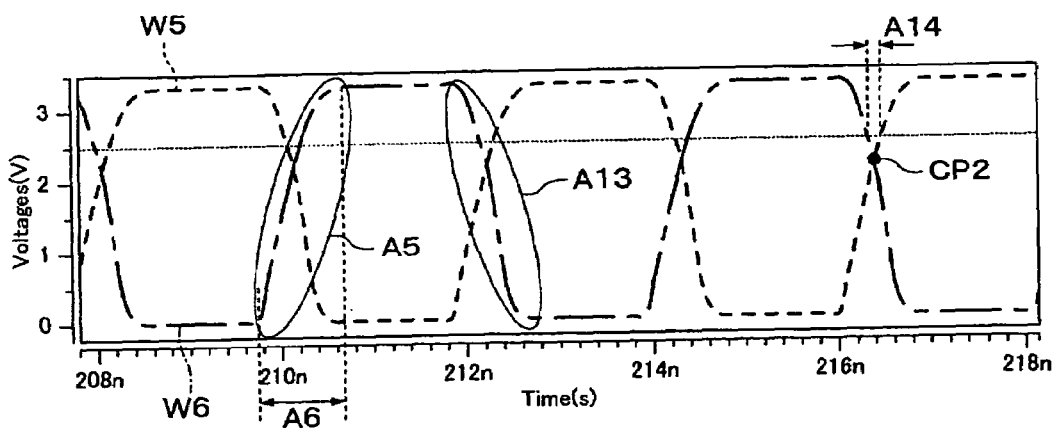

FIG. 3A shows the waveform of the signal input to the input Buf_In1 of the buffers 10. The waveform W1 in FIG. 3A shows the waveform of the signal HS_DPout1 in FIG. 1 for example, the waveform W2 shows the waveform of the signal HS_DMout1 in FIG. 1. FIG. 3B shows the waveform of the signal at the input node ND12 of the inverter INV2 when the waveform shown in FIG. 3A is input to the input Buf_In1 of the buffers 10. FIG. 3C shows the waveform of the signal, which is output from the output Buf_Out1 of the buffers 10 when the waveform shown in FIG. 3A is input to the input Buf_In1 of the buffers 10. Here, FIG. 3B and 3C show signal waveforms when the all switching signals SS1 to SS3 in FIG. 2 are set active.

Here, the waveform W1, which is input to the input Buf_In1 of the buffers 10, becomes a waveform W4 at the node ND12 of the inverter INV2 (shown in FIG. 3B) on the way and finally becomes a waveform W5 at the output Buf_Out1 of the buffers 10 (shown in FIG. 3C). Similarly, the waveform W2 in FIG. 3A becomes a waveform W3 in FIG. 3B and finally becomes a waveform W6 of the buffers 10 in FIG. 3C.

When the signal HS_DPout1, which is input to the input Buf_In1 of the buffers 10 in FIG. 2, is changed to high level from low level, the transistor PTR1 is turned to an OFF state from an OFF state and the transistor NTR1 is turned to an ON state from an OFF state in the inverter INV1 in FIG. 2. Thus, the potential of the node ND12 falls down to the low level potential (the potential of the second power source VSS for example) from the high level potential (the potential of the first power source VDD for example) thereby. For example, during time shown as the state A1 of the waveform W2 in FIG. 3A, the potential at the node ND12 in FIG. 2 falls down to the potential VSS from the potential VDD.

However, the value of the wiring capacitance at the node ND11 (or ND12) in FIG. 2 is increased by the capacitance-arrangement circuit 100. Thus, during time shown as the state A1 in FIG. 3A, the potential of the node ND12, which has been the high level, lowers to around 1V shown in the state A2 in FIG. 3B thereby, in spite of lowering the low level. Then, the potential of the node ND12 lowers to the low level after time shown as the state A3 in FIG. 3B. Namely, the time when the potential of the node ND12 falls down to the low level from the high level is a time shown as the state A4 in FIG. 3B. The gradient of the potential change of the node ND12 during time shown as the state A4 is more moderate than that during time when the values of the capacitance wiring of the node ND11 and ND12 are small.

Lowering the potential of the node ND12 to the low level from the high level causes the transistor PTR2 to be turned to an ON state from an OFF state and the transistor NTR2 to be turned to an OFF state from an ON state. Thus, as shown in the state A5 in FIG. 3C, the potential of the input Buf_Out1 of the buffers 10 increases to the high level from the low level. Here, the gradient of the potential change of the node ND12 is more moderate because of increasing the value of the wiring capacitance of the node ND11 (or ND12) due to work of the capacitance-arrangement circuit 100. Hence, time as shown in the state A6 in FIG. 3C, is needed in order to increase the potential of the input Buf_Out1 of the buffers 10 to the high level from the low level.

Here, when comparing a part of the waveform W1 in the state A1 of FIG. 3A with a part of the waveform W6 in the state A5 of FIG. 3C, the gradient of the potential change in a part of the waveform in the state A5 is more moderate. Time for reaching the high level from the low level in the state A6 is longer than that in the state A7 of FIG. 3A.

Similarly, when the signal HS_DPout1, which is input to the input Buf_In1 of the buffers 10 in FIG. 2, is changed to high level from low level (in the state A8 of FIG. 3A, for example), the transistor PTR1 is turned to an ON state from an OFF state and the transistor NTR1 is turned to an OFF state from an ON state in the inverter INV1 in FIG. 2. This turning boosts the potential of the node ND12 to a high level from a low level.

However, during the term indicated as the A9 in FIG. 3A (or the A11 in FIG. 3B), the capacitance-arrangement circuit 100 boosts the potential of the node 12 not to a high level but to around 2V, for example, as shown in the A10 of FIG. 3B. Then, the potential of the node ND12 increases to a high level after time shown as the state A12 in FIG. 3B. Namely, a term when the potential of the node ND12 rises up to a high level from a low level, is a term as the sum of the term A11 with the term A12 shown in 3B. The gradient of the potential change of the node ND12 during this summed term is more moderate than that in time when the value of the capacitance wiring of the node ND11 (ND12) is small.

The gradient of the potential change of the inverter INV2 (namely, the output Buf_Out1) is indicated as the gradient of a waveform in the A13 of FIG. 3C since the gradient of the potential change of the node ND12 is moderate. The gradient of the potential change in the A13 of FIG. 3C is more moderate than that in the A8 of FIG. 3A.

As the described above, the signal waveform, input to the input Buf_In1 of the buffers 10, outputs from the Buf_Out1 of the buffers 10 as a waveform of which the potential gradient is changed by the capacitance-arrangement circuit 100.

Next, the cross-point of the waveform W1 with the W2 in FIG. 3A and the cross-point of the waveform W5 with the W6 in FIG. 3C are described.

We compare the cross-point CP1 of the waveform W1 with the W2 in FIG. 3A with the cross-point CP2 of the waveform W5 with the W6. The potential is around 1.5V at the CP1 in FIG. 3A. The potential is around 2.3V at the CP2 in FIG. 3C. In a case when the capacitance-arrangement circuit 100 does not exist (or all switching signals SS1 to SS3 are non-active), the potential of the output waveform from the output Buf_Out1 of the buffers 10 is almost equal to a level at the CP1 at the cross-point. Hence, the potential of the output waveform of the buffers 10, when all switching signals SS1 to SS3 are non-active, is almost 1.5V.

The waveform W5 shown in FIG. 3C is an output waveform of the buffers 10 and also a waveform outputting to the gate of the transistor SW1 in FIG. 1. Similarly, the waveform W6 shown in FIG. 3C is a waveform outputting to the gate of the transistor SW2 in FIG. 1 The transistor SW1 and SW2 are a N type transistor for example, turned an ON state when the signal inputting to the gates thereof is a high level. In the present embodiment, the threshold of a transistor is 2.5V for example. At this time, the term when the waveforms W1 and W2 in FIG. 3A are under 2.5V is a term shown as the A15 for example. At this time, the term when the waveforms W5 and W6 in FIG. 3C are under 2.5V, is a term shown as the A14 for example. During the term shown as the A14, the transistors SW1 and SW2 are an OFF state. Further, the waveforms W1 and W2 are deemed to be the output waveforms of the buffer 20 when the capacitance-arrangement circuit 100 does not exist (or the switching signals SS1 to SS3 are all non-active). Namely, during the term shown in the A15, the transistors SW1 and SW2 in FIG. 1 are an OFF state in the case when the capacitance-arrangement circuit 100 does not exist (or the switching signals SS1 to SS3 are all non-active.)

When comparing the term A14 with the term A15, A15 is longer. This is because the potential at the cross-point CP1 in FIG. 3A is lower than the potential at the cross-point CP2 in FIG. 3C.

During the term when the transistors SW1 and SW2 in FIG. 1 are an OFF state, charge is stored in the node ND10 by the current source 20. An amount of charge stored in the node ND10 increases when the term of the above OFF state is longer. After storing charge in the node ND10, when the transistor SW1 is turned an ON state for example, the potential at the DP terminal 30 rapidly changes. The rapid potential change is proportional to an amount of charge stored in the node ND10. Namely, the term A15 in FIG. 3A is longer than the term A14 in FIG. 3C making the potential change at the DP terminal 30 or 40 sharp comparing to a case when the wiring capacitance between the inverters INV1 and INV2 is increased by the capacitance-arrangement circuit 100. As described above, when the wiring capacitance between the inverters INV1 and INV2 changes, the output waveform of the buffers 10 changes making the term of an OFF state of transistors SW1 and SW2 in FIG. 1 change. A mount of charge stored in the node ND10 is determined depending on the length of the term and the amount determines the potential change at the DP terminals 30 and 40.

Accordingly, the capacitance-arrangement circuit 100 adjusts the wiring capacitance between the inverters INV1 and INV2 arranging the gradient of the potential change at the DP terminals 30 and 40 of the transmission circuit 200.

Figure 4A:
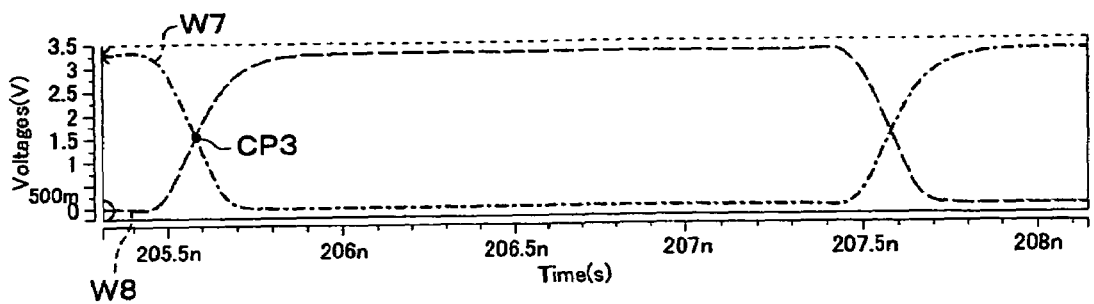
FIGS. 4A to 4D show waveforms outputting from the buffers corresponding to a capacitance-arrangement circuit in the first embodiment.

FIGS. 4A to 4D show waveforms of the buffers 10 corresponding to numbers of transistors among transistors NTR3 to NTR5 of the capacitance-arrangement circuit, which are an ON state. FIG. 4A shows output waveforms outputting from the buffers 10 when all transistors NTR3 to NTR5 are an OFF state, namely when a line between the inverters INV1 and INV2 is not connected to a capacitive element as additional capacitance. A waveform W7 is a waveform outputting to the gate of the transistor SW1 in FIG. 1 and a waveform W8 is a waveform outputting to the gate of the transistor SW2 for example. A cross-point CP3 is a point in which the waveforms W7 and W8 cross each other.

Figure 4B:
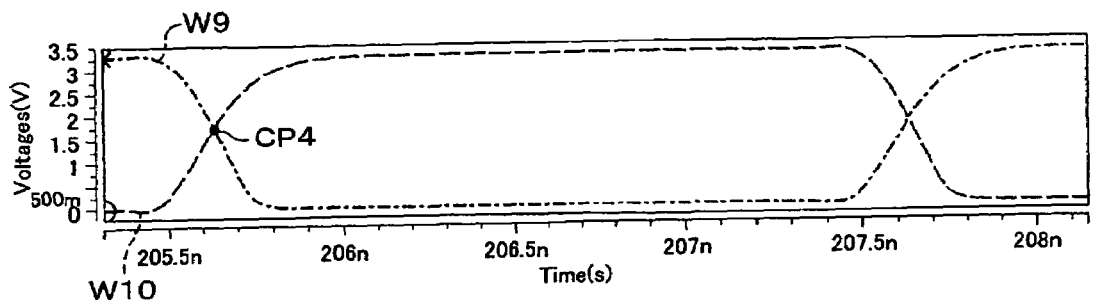

FIG. 4B shows out put waveforms outputting from the buffers 10 when one of transistors NTR3 to NTR5 (the transistor NTR3, for example) is an ON state, namely when a line between the inverters INV1 and INV2 is connected to a capacitive element (the capacitive element NMOS1 for example.) Here, capacitive values of the capacitive elements NMOS1 to NMOS3 are all identical, but, not limited to. Values of the capacitive elements NMOS1 to NMOS3 may be set in an arbitrary manner or different each other.

A waveform W9 is a waveform outputting to the gate of the transistor SW1 and W10 is a waveform outputting to the gate of the transistor SW2 for example. A cross-point CP4 is a point where the waveforms W9 and W10 cross each other. FIG. 4B shows that the rising gradient of the waveform 10 is more moderate than that of the waveform W8 in FIG. 4A. This moderate gradient is caused by increase of the wiring capacitance between the inverters INV1 and INV2 by connecting a capacitive element to a line between the inverters INV1 and INV2.

Figure 4C:
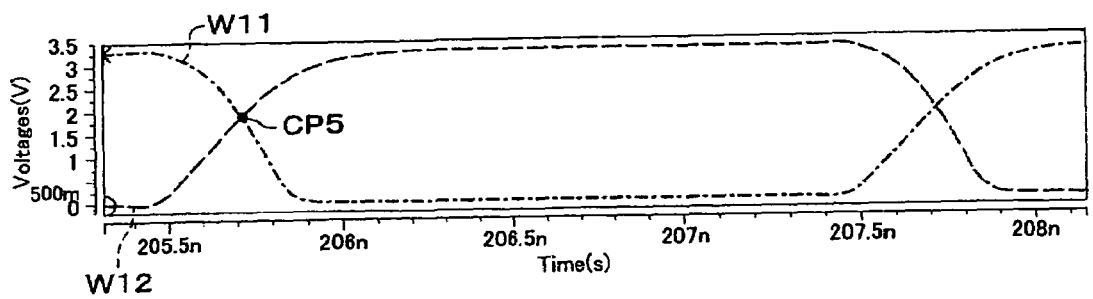

FIG. 4C shows waveforms outputting from the buffers 10 when one of transistors NTR3 to NTR5 (the transistor NTR5, for example) is an OFF state, namely when a line between the inverters INV1 and INV2 is connected to two capacitive elements (the capacitive elements NMOS1 and NMOS2 for example.)

A waveform W11 is a waveform outputting to the gate of the transistor SW1 in FIG. 1 and a W10 is a waveform outputting to the gate of the transistor SW2 in FIG. 1 for example. A cross-point CP5 is a point where the waveforms W11 and W12 cross each other. FIG. 4C shows that the rising gradient of the waveform 12 is more moderate than that of the waveforms W8 in FIG. 4A and W10 in FIG. 4B. This moderate gradient is caused by increase of the wiring capacitance between the inverters INV1 and INV2 by connecting two capacitive elements to a line between the inverters INV1 and INV2.

Figure 4D:
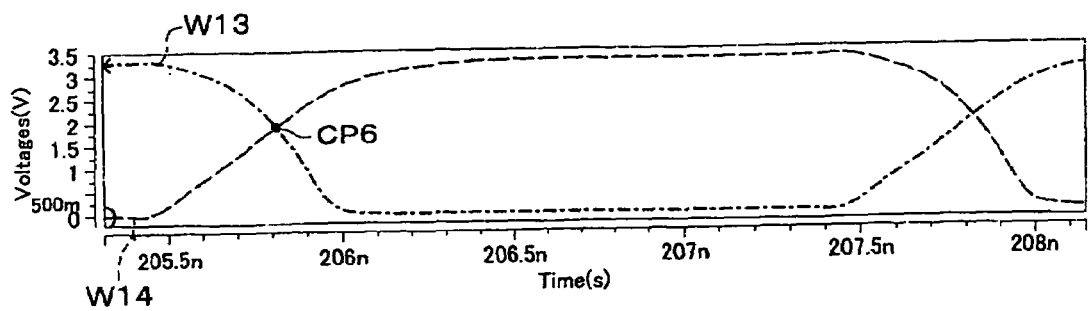

FIG. 4D shows waveforms outputting from the buffers 10 when all transistors NTR3 to NTR5 are an ON state, namely when a line between the inverters INV1 and INV2 is connected to all capacitive elements.

A waveform W13 is a waveform outputting to the gate of the transistor SW1 in FIG. 1 and a W14 is a waveform outputting to the gate of the transistor SW2 in FIG. 1 for example. A cross-point CP6 is a point where the waveforms W13 and W14 cross each other. FIG. 4D shows that the rising gradient of the waveform 14 is more moderate than that of the waveforms W8 in FIG. 4A, W10 in FIG. 4B and W12 in FIG. 4C. This gradient is caused by increase of the wiring capacitance between the inverters INV1 and INV2 by connecting all capacitive elements to a line between the inverters INV1 and INV2.

Comparing the waveforms W8, W12 and W14 in FIG. 4A to 4D each other shows a tendency that rising gradients of these waveforms becomes moderate in response to increase of capacitance in the capacitance-arrangement circuit 100.

Figure 5:
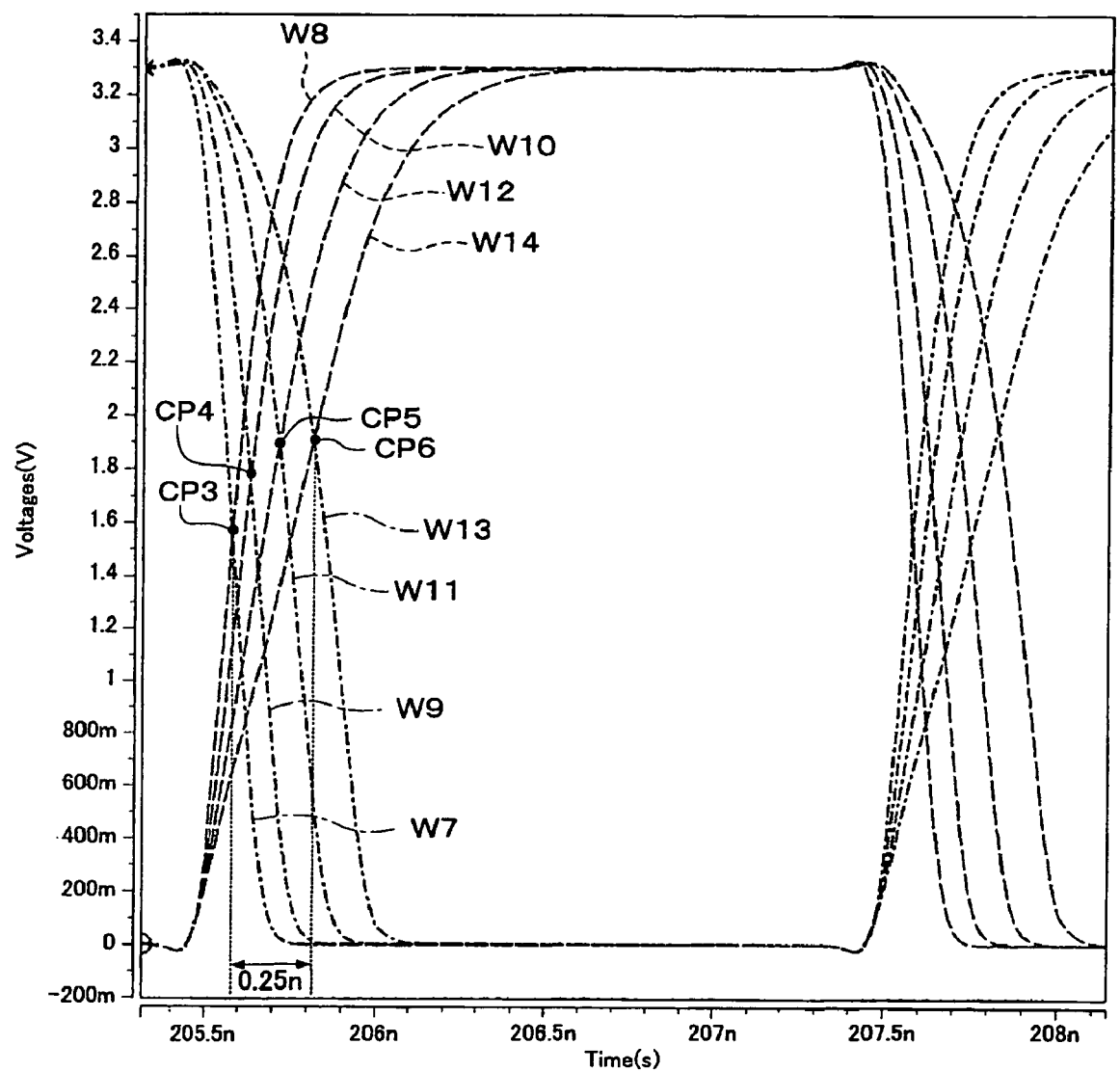
FIG. 5 shows waveforms in FIGS. 4A to 4D, which are superimposed each other.

FIG. 5 shows the waveforms W7 to W14 in FIG. A to FIG. D, which are superimposed each other. According to FIG. 5, the potential at the cross-point CP6 where the waveforms W13 and W14 cross each other and have the largest amount of the wiring capacitance between the inverters INV1 and INV2, is the highest among the potentials at CP3 to CP6. On the other hand, the potential at the cross-point CP3 where the waveforms W7 and W8 cross each other and have the smallest amount of the wiring capacitance between the inverters INV1 and INV2, is the lowest among the potentials at CP3 to CP6. Namely, increasing the wiring capacitance between the inverters INV1 and INV2 makes the potential at a cross-point higher and vice versa. Here, as descried above, when the potential at the cross-point becomes higher, the term when the transistors SW1 and SW2 are an OFF state, becomes shorter and rising a signal outputting from the DP terminal 30 and DM terminal 40 becomes moderate. On the contrary, when the potential at the cross-point becomes lower, the term when the transistors SW1 and SW2 are an OFF state, becomes longer and rising a signal outputting from the DP terminal 30 and DM terminal 40 becomes sharp.

FIG. 6 to FIG. 9 show waveforms of signals outputting from the DP terminal 30 and the DM terminal 40 of the transmission circuit 200.

Figure 6:
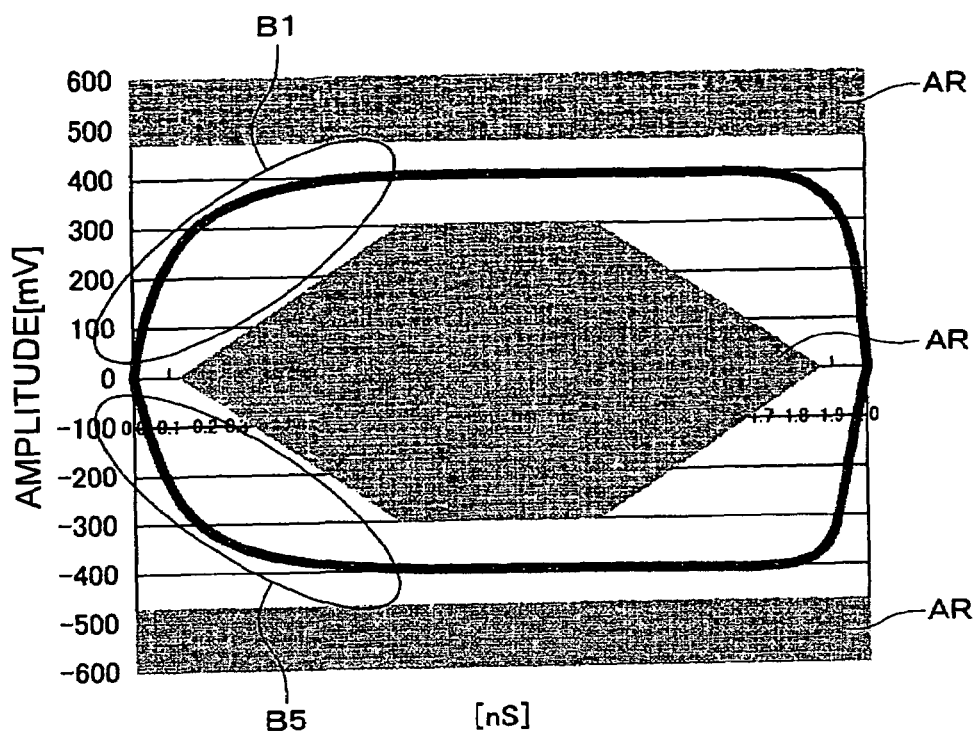
FIG. 6 shows the waveform of a signal outputting from the transmission circuit when a signal having a waveform in FIG. 4A is input to the transmission circuit.
Figure 7:
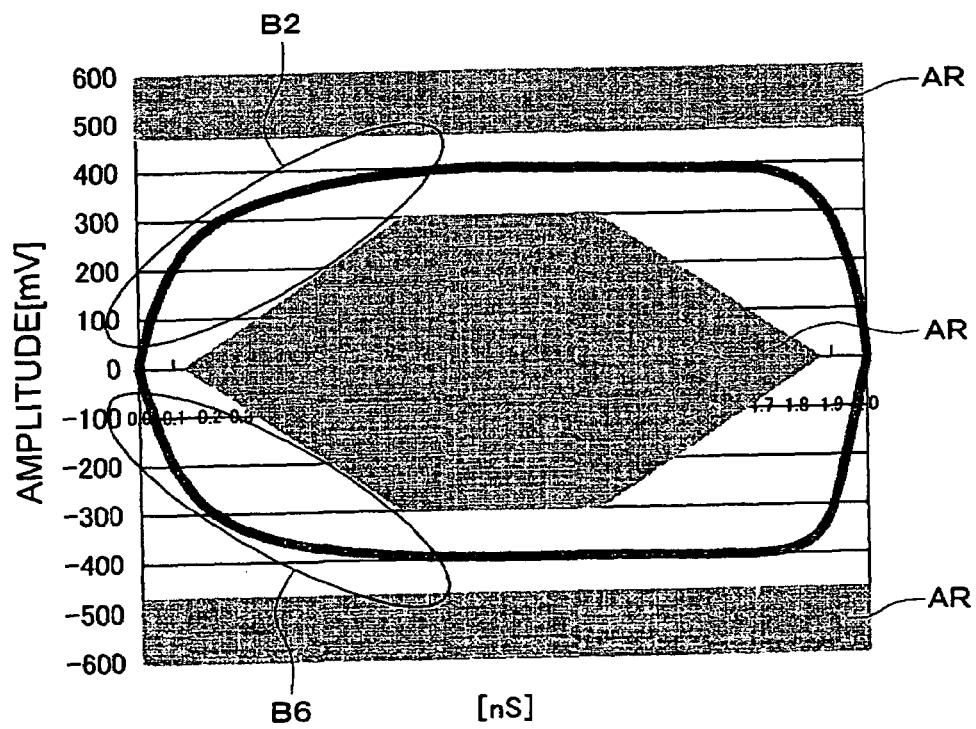
FIG. 7 shows the waveform of a signal outputting from the transmission circuit when a signal having a waveform in FIG. 4B is input to the transmission circuit.
Figure 8:
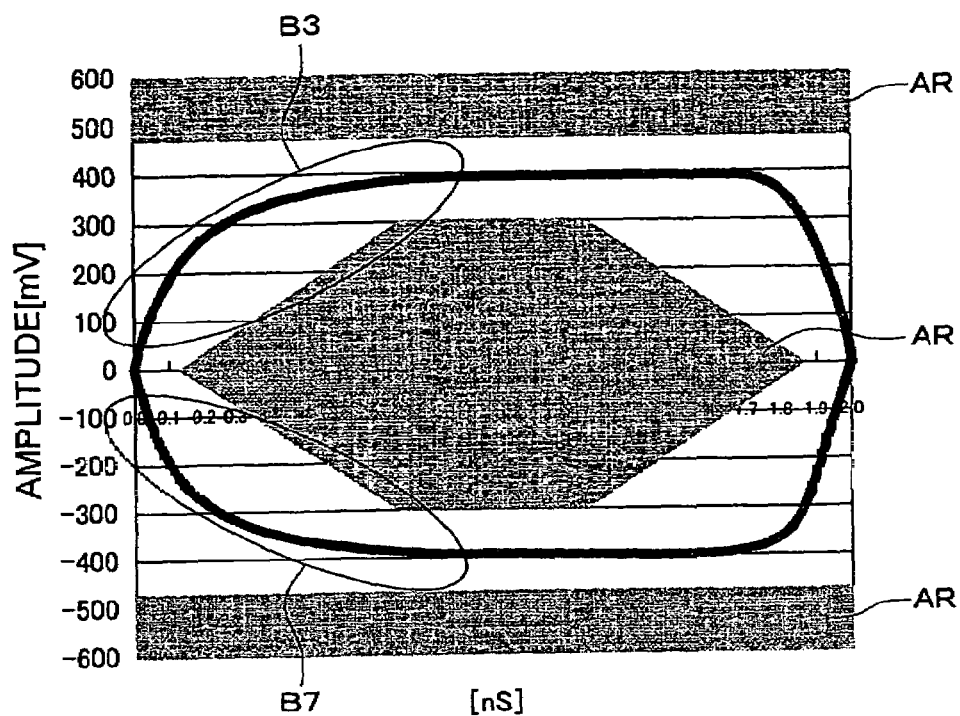
FIG. 8 shows the waveform of a signal outputting from the transmission circuit when a signal having a waveform in FIG. 4C is input to the transmission circuit.
Figure 9:
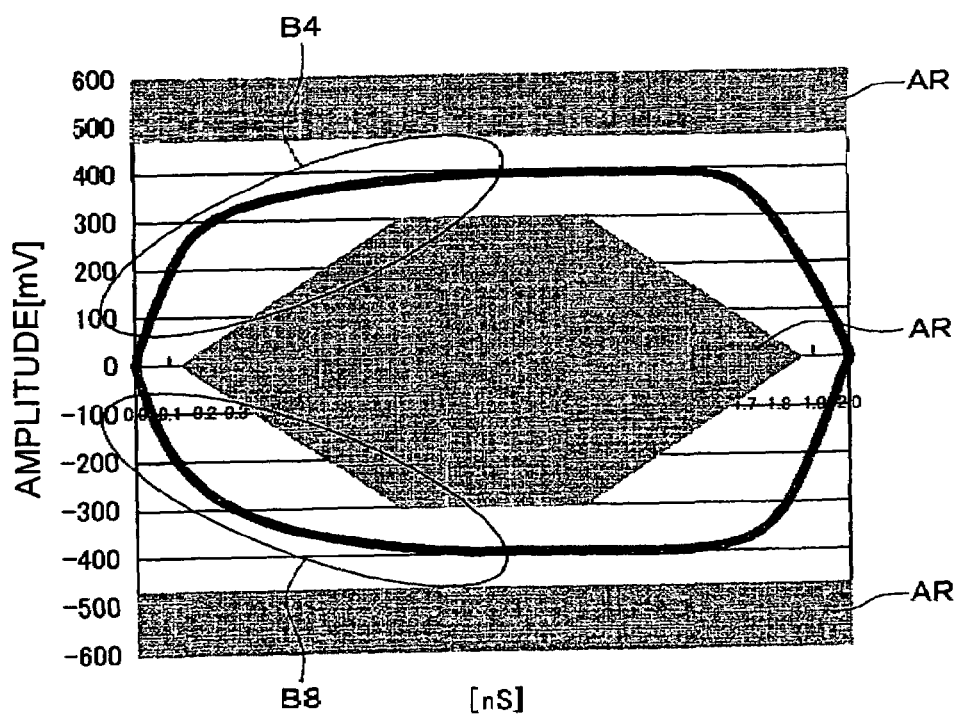
FIG. 9 shows the waveform of a signal outputting from the transmission circuit when a signal having a waveform in FIG. 4D is input to the transmission circuit.

FIG. 6 shows a waveform outputting from the DP terminal 30 and the DM terminal 40 when each of the waveforms W7 and W8 in FIG. 4A is input to each of the gates of the transistors SW1 and SW2. Similarly, FIG. 7 shows a waveform outputting from the DP terminal 30 and the DM terminal 40 when each of the waveforms W9 and W10 in FIG. 4B, each of the waveforms W11 and W12 in FIG. 4C, and each of the waveforms W13 and W14 in FIG. 4D are input to each of the gates of the transistors SW1 and SW2.

A reference numeral AR represents an area prohibiting the formation of a signal waveform defined in the USB standard. In order to meet the transmittance circuit 200 to the USB standard, the circuit should be designed not so as to superimpose the amplitude of the signal outputting from the DP terminal 30 and the DM terminal 40 onto the inhibit area AR. As shown in FIG. 6, the figure including the inhibit area AR and a signal waveform is referred to as an eye pattern. Reference numerals B1 to B8 are a part of waveforms.

Comparing parts indicated as B1 to B4 in FIG. 6 to FIG. 9 exhibits that waveforms have different periods between start of their rising and arrive at the maximum amplitude. The waveform B1 in FIG. 6 shows the shortest period from rising to arrive at the maximum amplitude among the waveforms B1 to B4. In other word, the rising gradient shown as the B1 is the sharpest among the B1 to B4. On the other hand, the waveform B4 shows the longest period from rising to arrive at the maximum amplitude among the waveforms B1 to B4. In other word, the rising gradient shown as the B4 is the most moderate among the B1 to B4.

FIG. 4A shows a waveform outputting from the buffers 10 when the additional capacitance in the capacitance-arrangement circuit 100 is the smallest. FIG. 4B to 4D show waveforms outputting from the buffers 10 when the additional capacitance in the capacitance-arrangement circuit is increased as the order of FIGS. 4B, 4C and 4D. Namely, the numerals B1 to B4 shows a tendency of changing eye patterns in response to change of additional capacitance of in the capacitance-arrangement circuit 100.

In detail, increasing additional capacitance of the capacitance-arrangement circuit 100 makes the rising gradient of the output waveform of the transmission circuit 200 (or an eye pattern) more moderate. On the contrary, decreasing additional capacitance of in the capacitance-arrangement circuit 100 makes the rising gradient of the output waveform of the transmission circuit 200 (or an eye pattern) more sharper.

Similarly, comparing the numerals B5 to B8 in FIG. 6 to FIG. 9 shows that the numeral B5 is the shortest period from start of falling to arrive at the maximum amplitude (the minimum value in this case) and the numeral B8 is the longest.

Accordingly, the transmission circuit 200 of the present embodiment can change the gradient of rinsing and falling of a waveform outputting from the circuit with multiple steps by adjusting additional capacitances in the capacitance-arrangement circuit 100.

Figure 10:
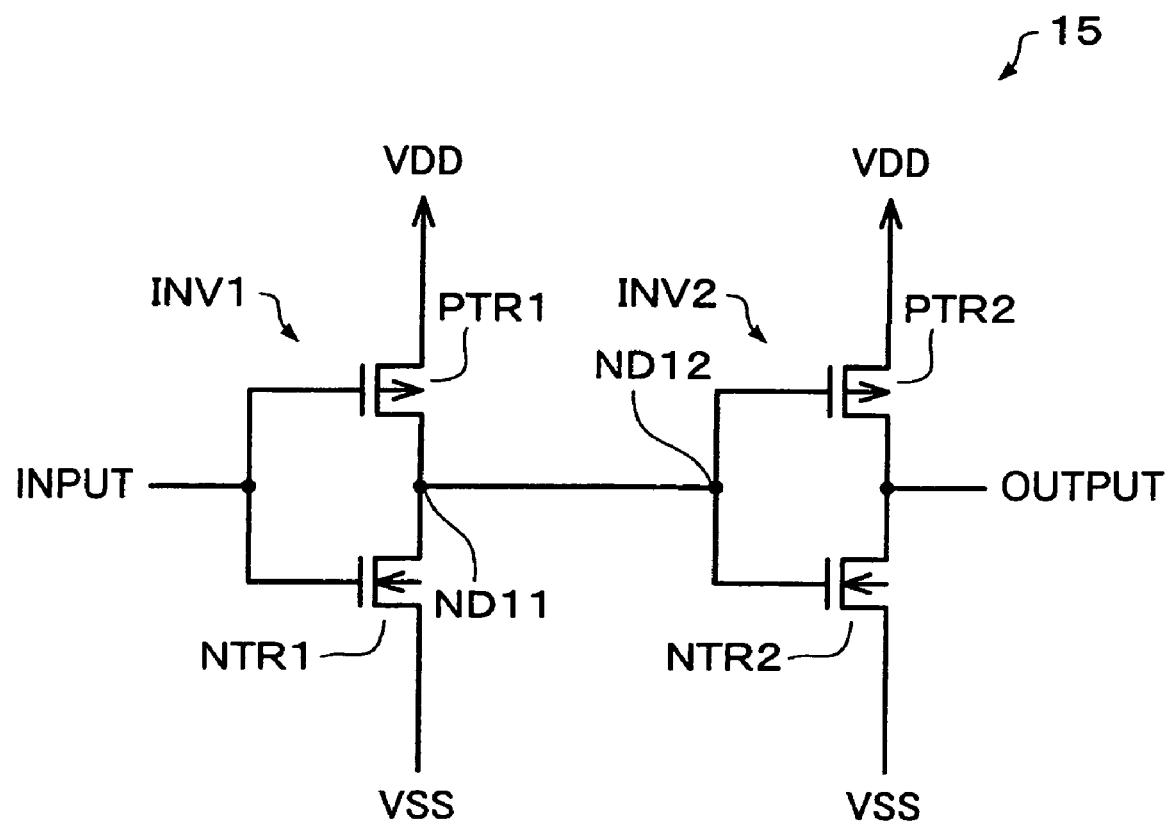
FIG. 10 is a circuit diagram showing a buffer of the comparison.

FIG. 10 shows a buffer 15, as comparison, where the capacitance-arrangement circuit 100 is removed from the buffers 10 in FIG. 1. If the buffer 15 in FIG. 10 is used in the transmission circuit, waveforms outputting from the transmission circuit are fixed due to non existence of where the capacitance-arrangement circuit 100. Accuracy and quality of receiving circuits of a host controller or a device controller are sometimes not met the USB standard due to specification at the design stage or variation of products on manufacturing processes. The transmission circuit including the buffer 15 in FIG. 10 cannot frequently transfer data to such products accurately.

Meanwhile, the transmission circuit 200 of the present embodiment can adjust an eye pattern (the rising gradient and/or the falling gradient of output waveform, for example), transferring data accurately even if a receiving circuit in a host controller or a device controller does not strictly meet the USB standard.

2.2 Second Embodiment

Figure 11:
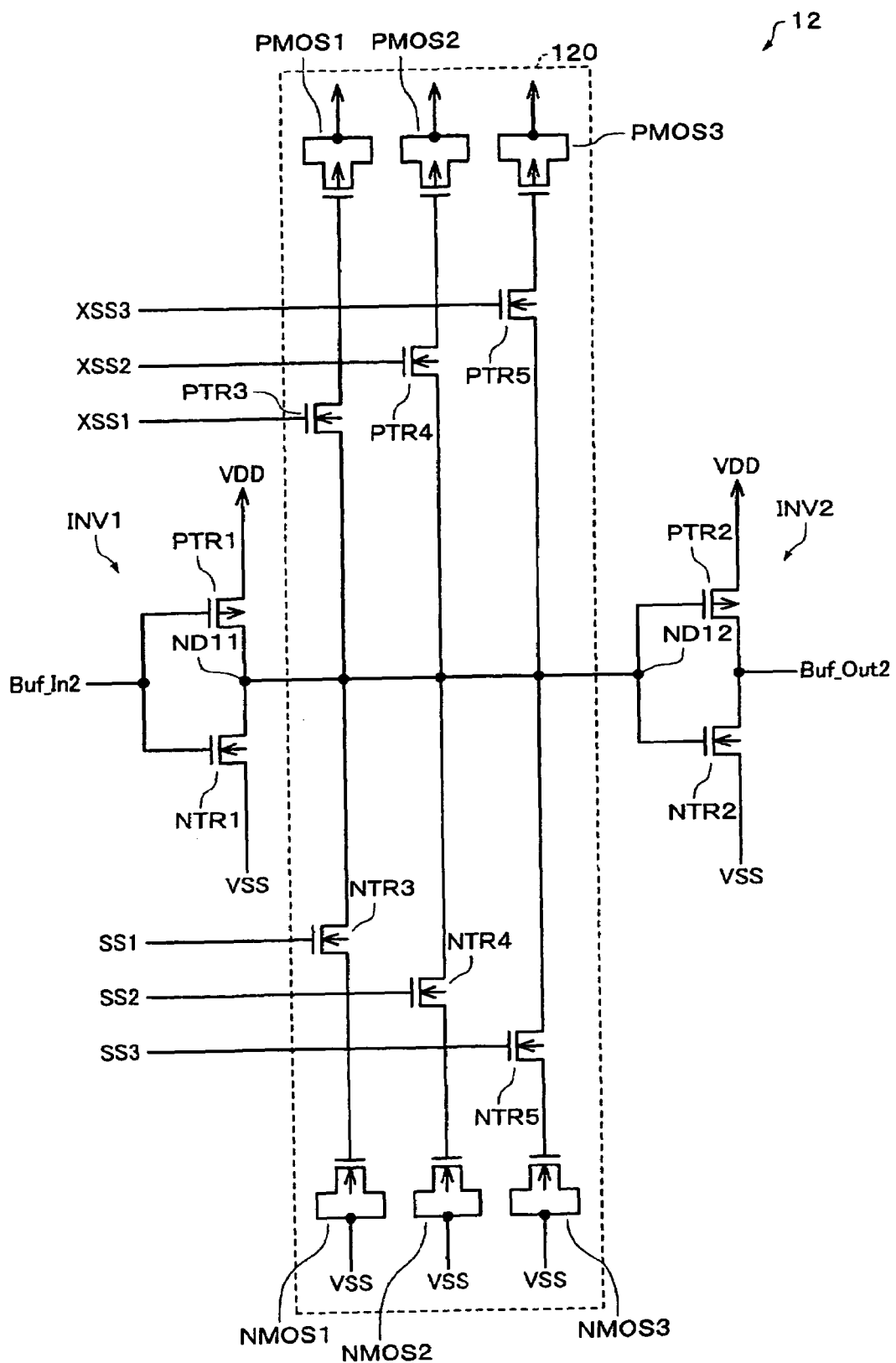
FIG. 11 is a circuit diagram showing a buffer of the second embodiment.

As the second embodiment, buffers 12-1 to 12-3 are installed in the transmission circuit 200 in FIG. 1 instead of buffers 10-lot 10-3. The buffers 12-1 to 12-3 are called as the buffers 12 hereafter as a generic term. FIG. 11 shows a detail circuit of the buffers 12. The buffers 12 of the second embodiment Include a capacitance-arrangement circuit 12, that is different from the buffers 10 of the first embodiment including the capacitance-arrangement circuit 100. Other constitutions in the present embodiment are the same in the buffers 10 according to the first embodiment.

The capacitance-arrangement circuit 120 includes transistors NTR3 to NTR5, capacitive elements NMOS1 to NMOS3, transistors PTR3 to PTR5 (a second switching element in the broad sense), and capacitive elements PMOS1 to PMOS3 (a second capacitive element in the broader sense). Connections of transistors NTR3 to NTR5 and capacitive elements NMOS1 to NMOS3 are identical to that in the first embodiment. End of each of transistors PTR3 to PTR5 is connected to a line between the output node ND11 of the inverter INV1 and the input node ND12 of the inverter NV2. Other end of each of transistors PTR3 to PTR5 is connected to each of capacitive elements PMOS1 to PMOS3. In the present embodiment, each of capacitive elements PMOS1 to PMOS3 comprises a P type MOS transistor, but is not limited to such transistor. Each of each of capacitive elements PMOS1 to PMOS3 may comprise a first and second polysilicon thin films.

In the present embodiment, other end of each of transistors PTR3 to PTR5 is connected to the gate of each of capacitive elements PMOS1 to PMOS3 and the source and drain thereof is connected to the second power source VDD. Each of switching signals XSS1 to XSS3 is input to the gate of each of transistors PTR3 to PTR5.

When at least any one of switching signals SS1 to SS3 is set active, transistors among transistors NTR3 to NTR5, which are set active, are turned to ON state. Each of switching signals XSS1 to XSS3, which are inverted from the signals SS1 to SS3, is input to the gate of each of transistors PTR3 to PTR5. When the switching signal SS1 is set active for example, the transistor NTR3 is turned ON. At this time, the switching signal XSS1, inverted from the switching signal SS1, is input to the gate of the transistor PTR3, being turned ON. Thus, the capacitive elements NMOS1 and PMOS3 can be connected to a line between the node ND11 and node ND12 thereby. This connection increases wiring capacitance of the output node ND11 of the inverter INV1 (or the input node ND12 of the inverter INV12.) Namely, controlling each of switching signals SS1 to SS3 can adjust the value of the wiring capacitance of the node ND11 (or node ND12) with multiple steps.

The value of the wiring capacitance of the output node ND11 in the inverter INV1 (or the input node ND12 of the inverter INV2) is adjusted so as to arbitrarily adjust signal waveform Buf_Out2, the output from the inverter INV2, namely the output of the buffers 12. Here, according to the present embodiment, the signal output from the output Buf_Out2 of the buffers 12 is the signal HS_DPout2 or HS_DMout2, which is input to the gate of the transistor SW1 or SW2 of the transmission circuit 200 in FIG. 1. Namely, the waveform of the signals HS_DPout2 and HS_DMout2, which control the transistors SW1 and SW2, can be adjusted so as to adjust the waveform of the differential signals outputting from the DP terminal 30 and the DM terminal 40.

Here, in the capacitance-arrangement circuit 120 of the present embodiment, three transistors NTR3 to NTR5 and three capacitive elements NMOS1 to NMOS3 are installed. The circuit is not limited to this setup, but two or four transistors and capacitive elements may be installed. Setting more than four transistors (first and second switching elements in the broader sense) and capacitive elements (first and second capacitive elements in the broader sense) makes setting additional capacitance further multiple steps.

Further, in the present embodiment, the switching signals XSS1 to XSS3 are inverted from the switching signals SS1 to SS3, but not limited to this inversion. The switching signals XSS1 to XSS3 may be controlled independently from the switching signals SS1 to SS3. Such independent control can set additional capacitance further multiple stages.

Figure 12A:
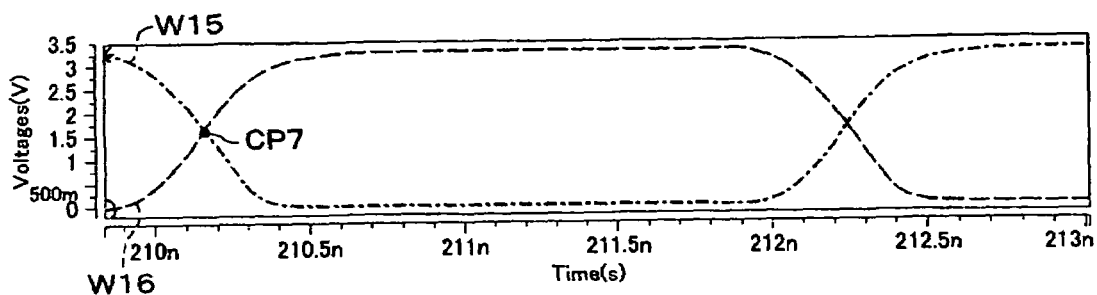
FIGS. 12A to 12D show waveforms outputting from the buffers corresponding to a capacitance-arrangement circuit in the second embodiment.

FIGS. 12A to 12D show waveforms of the buffers 10 corresponding to numbers of transistors among transistors NTR3 to NTR5 and PTR3 to PTR5 of the capacitance-arrangement circuit, which are an ON state. FIG. 12A shows waveforms out putting from the buffers 12 when all transistors NTR3 to NTR5 and PTR3 to PTR5 are an OFF state, namely when a line between the inverters INV1 and INV2 is not connected to a capacitive element as additional capacitance. A waveform W15 is a waveform outputting to the gate of the transistor SW1 in FIG. 1 and a waveform W16 is a waveform outputting to the gate of the transistor SW2 for example. A cross-point CP7 is a point in which the waveforms W15 and W16 cross each other.

Figure 12B:
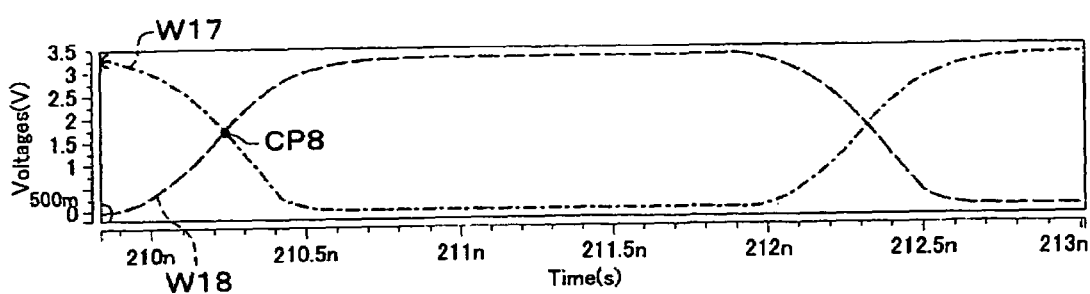

FIG. 12B shows waveforms outputting from the buffers 12 when one combination of transistors NTR3 to NTR5 and transistors PTR3 to PTR5 (the transistors NTR3 and PTR3 for example) is an ON state, namely when a line between the inverters INV1 and INV2 is connected to one combination of capacitive elements (the capacitive element NMOS1 and PMOS1 for example.) Here, in the present embodiment, the capacitive values of the capacitive element NMOS1 to NMOS3 are identical each other and the capacitive values of the capacitive element PMOS1 to PMOS3 are also identical each other, but not limited to this identity. The capacitive values of the capacitive element NMOS1 to NMOS3 and PMOS1 to PMOS3 may be set arbitrarily or different each other.

A waveform W17 is a waveform outputting to the gate of the transistor SW1 in FIG. 1 and a waveform W18 is a waveform outputting to the gate of the transistor SW2 for example. A cross-point CP8 is a point in which the waveforms W17 and W18 cross each other.

Figure 12C:
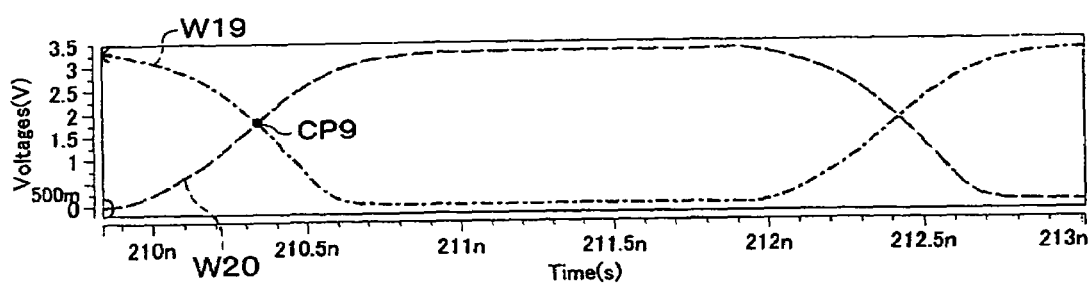

FIG. 12C shows waveforms outputting from the buffers 12 when one combination of transistors NTR3 to NTR5 and transistors PTR3 to PTR5 (the transistors NTR3 and PTR3 for example) is an OFF state, namely when a line between the inverters INV1 and INV2 is connected to two combinations of capacitive elements (the capacitive elements NMOS1 and PMOS1 and NMOS2 and PMOS2 for example.)

A waveform W19 is a waveform outputting to the gate of the transistor SW1 in FIG. 1 and a waveform W20 is a waveform outputting to the gate of the transistor SW2 for example. A cross-point CP9 is a point in which the waveforms W19 and W20 cross each other.

Figure 12D:
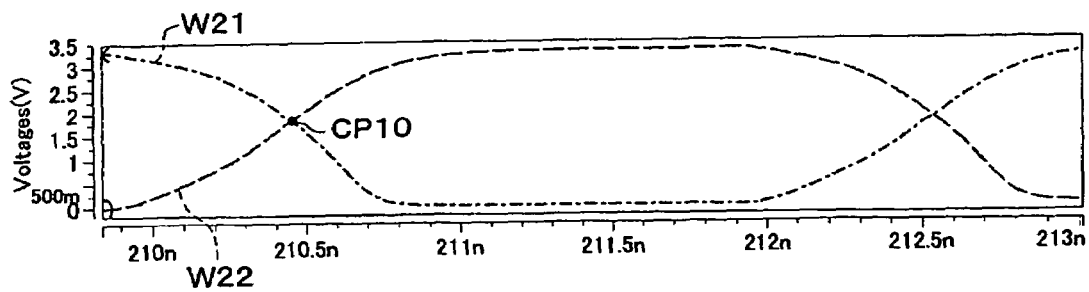

FIG. 12D shows waveforms outputting from the buffers 12 when all transistors NTR3 to NTR5 and PTR3 to PTR5 are an ON state, namely when a line between the inverters INV1 and INV2 is connected to all capacitive elements.

A waveform W21 is a waveform outputting to the gate of the transistor SW1 in FIG. 1 and a waveform W22 is a waveform outputting to the gate of the transistor SW2 for example. A cross-point CP10 is a point in which the waveforms W21 and W22 cross each other.

Comparing waveforms W16, W18, W20 and W22 in FIG. 12A to 12D shows that the rising gradients of these waveforms become moderate in response to increase of additional capacitance of the capacitance-arrangement circuit 120.

Figure 13:
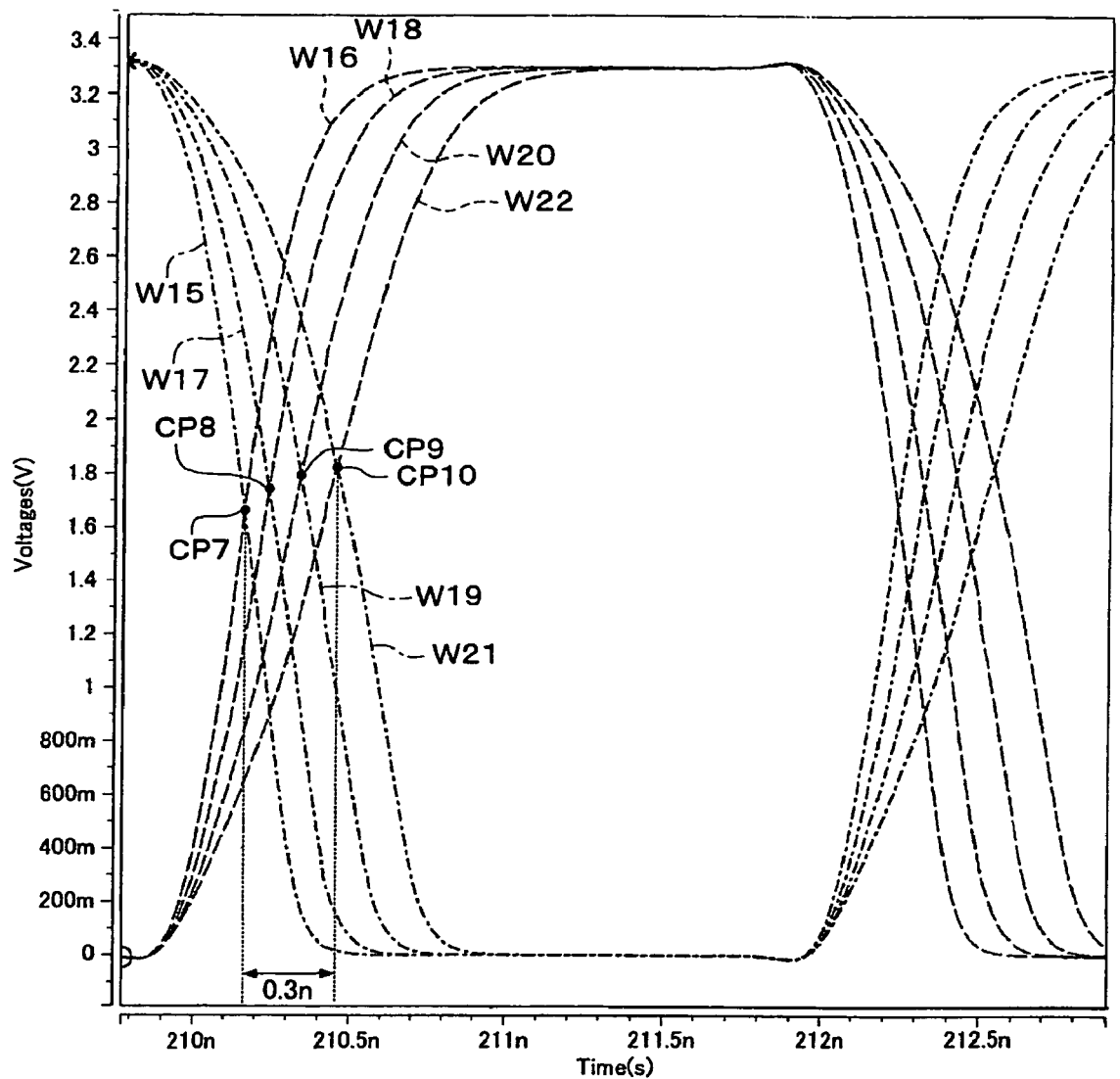
FIG. 13 shows waveforms in FIGS. 12A to 12D, which are superimposed each other.

FIG. 13 shows waveforms W15 to W22 in FIG. 4A to 4D, which are superimposed each other. According to FIG. 13, the potential at the cross-point CP10 of waveforms W21 and W22, which has the largest wiring capacitance between the inverters INV1 and INV2, is the highest among the potentials at the cross-points CP7 to CP10. The potential at the cross-point CP7 of waveforms W15 and W16, which has the smallest wiring capacitance between the inverters INV1 and INV2, is the lowest among the potentials at the cross-points CP7 to CP10. Namely, increasing the wiring capacitance between the inverters INV1 and INV2 makes the potential at a cross-point higher and decreasing it makes the potential lower. Here, as described before, changing the potential at the cross-point changes signal waveforms outputting from the DP terminal 30 and the DM terminal 40 in FIG. 1.

Here, comparing FIG. 5 of the first embodiment with FIG. 13 of the present embodiment shows that an amount of potential change at the cross-points CP7 to CP10 in FIG. 13 is very small comparing to the cross-points CP3 to CP6 in FIG. 5. According to the first embodiment, a waveform outputting from the transmission circuit is greatly changed if additional capacitance is changed. Meanwhile, in the present embodiment, change of a waveform outputting from the transmission circuit is small even if additional capacitance is changed since change of the potentials at cross-points is very small. Namely, the present embodiment can be applied to a case when a waveform outputting from the transmission circuit is finely adjusted within a small amount range.

According to the present embodiment, change of the potential at the cross-points is very small amount due to function of capacitive elements PMOS1 to PMOS3 (the second capacitive element in the broader sense) for example. If there are only the capacitive elements NMOS1 to NMOS3 (the first capacitive element in the broader sense), the potential at the cross-points is largely increased. But, adding the capacitive elements PMOS1 to PMOS3 make the potential at the cross-points increase moderately.

FIG. 14 to FIG. 17 show waveforms outputting from the DP terminal 30 and the DM terminal 40 of the transmission circuit of the present embodiment (the transmission circuit 200 where the buffers 10 is modified to the buffers 12) in order to clarify the change of waveforms outputting from the transmission circuit.

Figure 14:
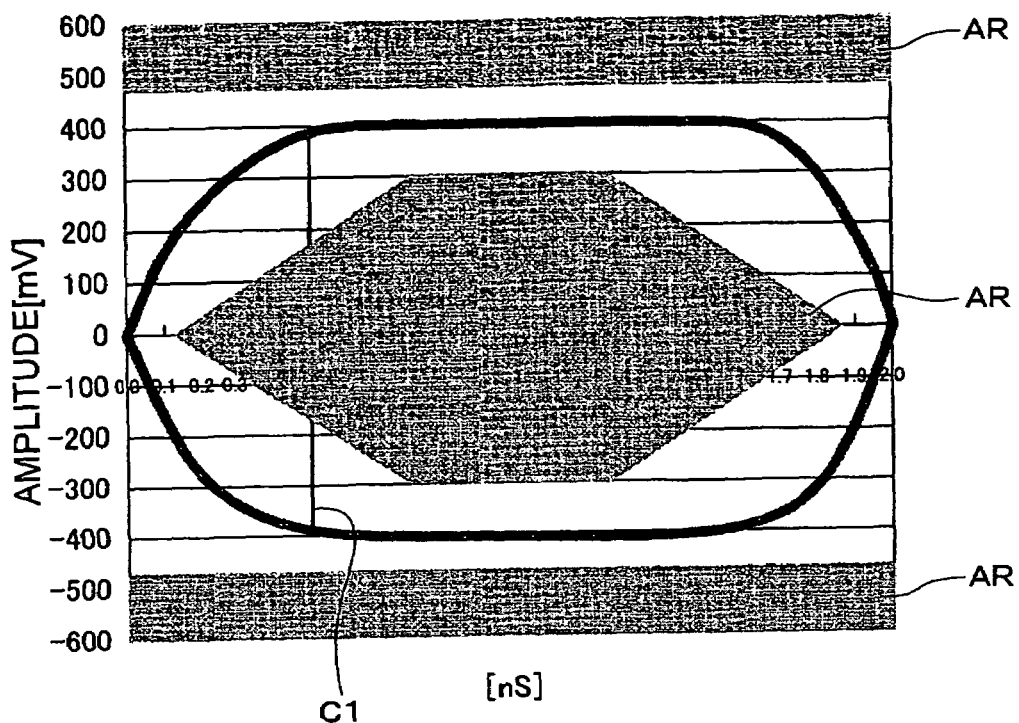
FIG. 14 shows the waveform of a signal outputting from the transmission circuit when a signal having a waveform in FIG. 12A is input to the transmission circuit.
Figure 15:
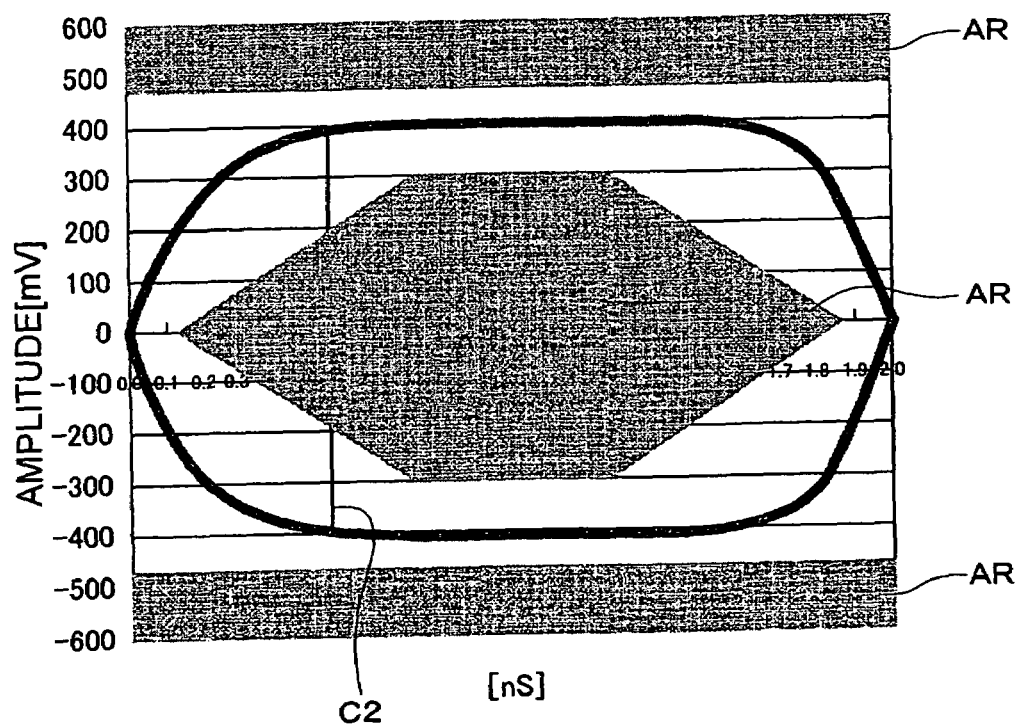
FIG. 15 shows the waveform of a signal outputting from the transmission circuit when a signal having a waveform in FIG. 12B is input to the transmission circuit.
Figure 16:
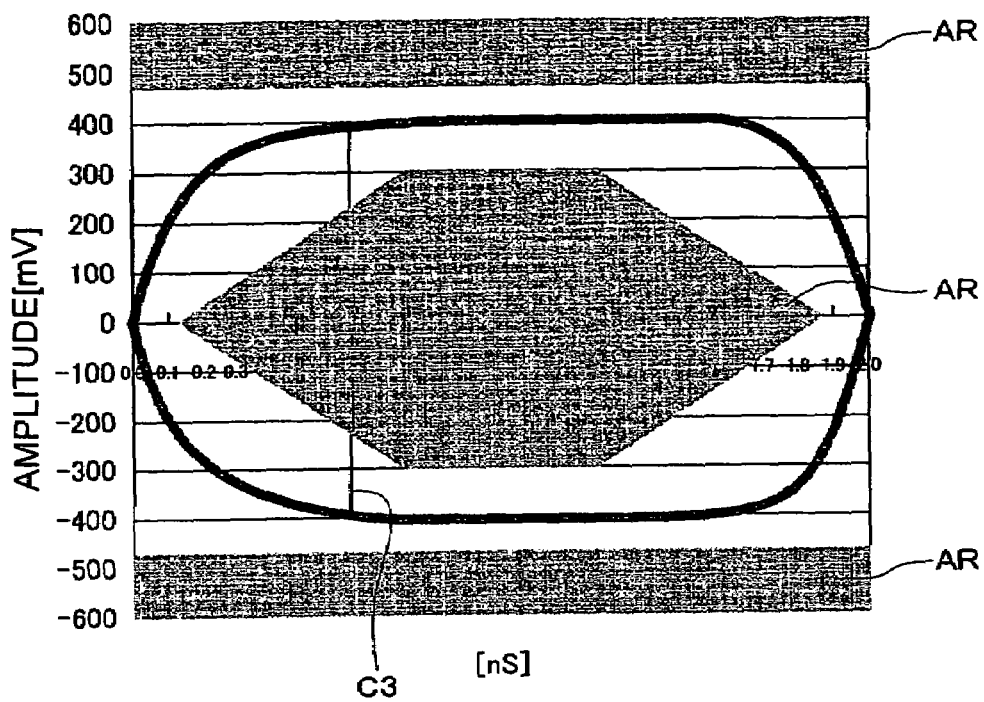
FIG. 16 shows the waveform of a signal outputting from the transmission circuit when a signal having a waveform in FIG. 12C is input to the transmission circuit.
Figure 17:
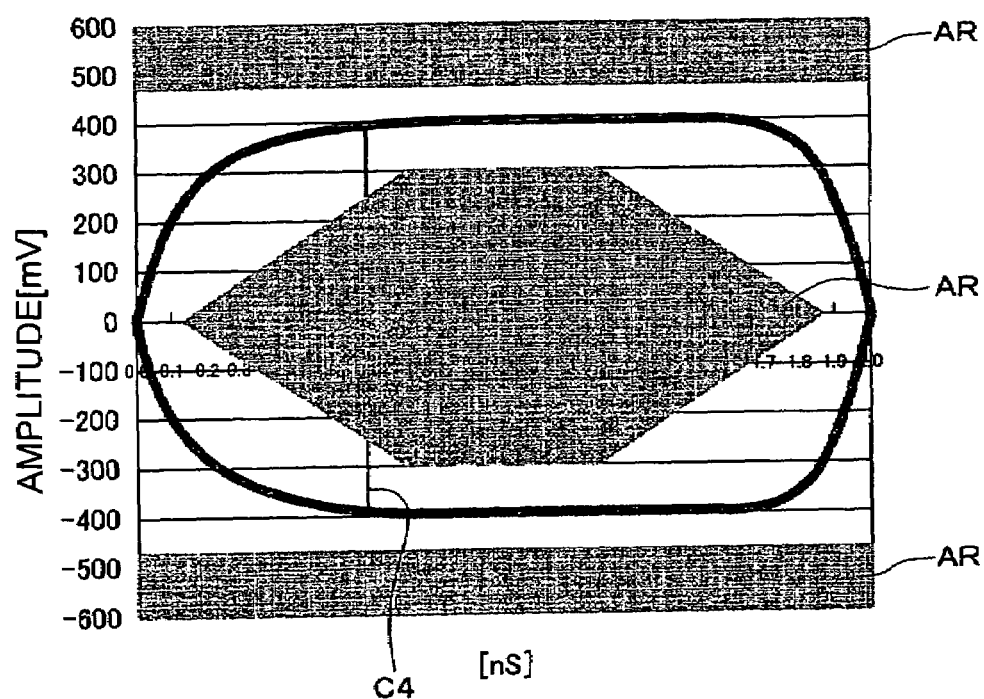
FIG. 17 shows the waveform of a signal outputting from the transmission circuit when a signal having a waveform in FIG. 12D is input to the transmission circuit.

FIG. 14 shows a waveform outputting from the DP terminal 30 and the DM terminal 40 when each of the waveforms W15 and W16 in FIG. 12A is input to each of the gates of the transistors SW1 and SW2. Similarly, FIG. 15 shows a waveform outputting from the DP terminal 30 and the DM terminal 40 when each of the waveforms W17 and W18 in FIG. 12B is input to each of the gates of the transistors SW1 and SW2. FIG. 16 shows a waveform outputting from them when each of the waveforms W19 and W20 in FIG. 12C is input to each of the gates of the transistors. FIG. 17 shows a waveform outputting from them when each of the waveforms W21 and W22 in FIG. 12D is input to each of the gates of the transistors.

In order to meet the transmittance circuit 200 to the USB standard, the circuit should be designed not so as to superimpose the amplitude of the signal outputting from the DP terminal 30 and the DM terminal 40 onto the inhibit area AR. Reference numerals C1 to C4 in FIG. 14 to FIG. 17 indicate time when values of waveform in FIG. 14 to FIG. 1 reach the value at the maximum amplitude.

Comparing reference numerals C1 to C4 in FIG. 14 to FIG. 17 indicates that time when values of waveform in FIG. 14 to FIG. 1 reach the value at the maximum amplitude, is different among waveforms. A period from a cross-point of two waveforms to the time C1, shown in FIG. 14, is the shortest among periods from a cross-point to reaching the maximum amplitude shown in FIG. 14 to FIG. 17. In other word, the rising gradient and falling gradient shown in FIG. 14 are the sharpest among gradients shown in FIG. 14 to FIG. 17. On the other hand, a period from a cross-point of two waveforms to the time C4, shown in FIG. 17, is the longest among periods from a cross-point to reaching the maximum amplitude shown in FIG. 14 to FIG. 17. In other word, the rising gradient and falling gradient shown in FIG. 17 are the most moderate among gradients shown in FIG. 14 to FIG. 17.

FIG. 12A shows a waveform outputting from the buffer 1 when the additional capacitance in the capacitance-arrangement circuit 120 is the smallest. FIG. 12B to 12D show waveforms outputting from the buffers 12 when the additional capacitance in the capacitance-arrangement circuit 120 is increased as the order of FIG. 12B, 12C and 12D. Namely, the numerals C1 to C4 show a tendency of changing eye patterns in response to change of additional capacitance in the capacitance-arrangement circuit 120.

Accordingly, the transmission circuit 200 of the present embodiment can change the gradient of rinsing and falling of a waveform outputting from the circuit with multiple steps by adjusting additional capacitances in the capacitance-arrangement circuit 120. In the present embodiment, the transmission circuit 200 can adjust an eye pattern (the rising gradient and/or the falling gradient of output waveform, for example), transferring data accurately even if a receiving circuit in a host controller or a device controller does not strictly meet the USB standard. This advantage is equal to that of the first embodiment.

Figure 18:
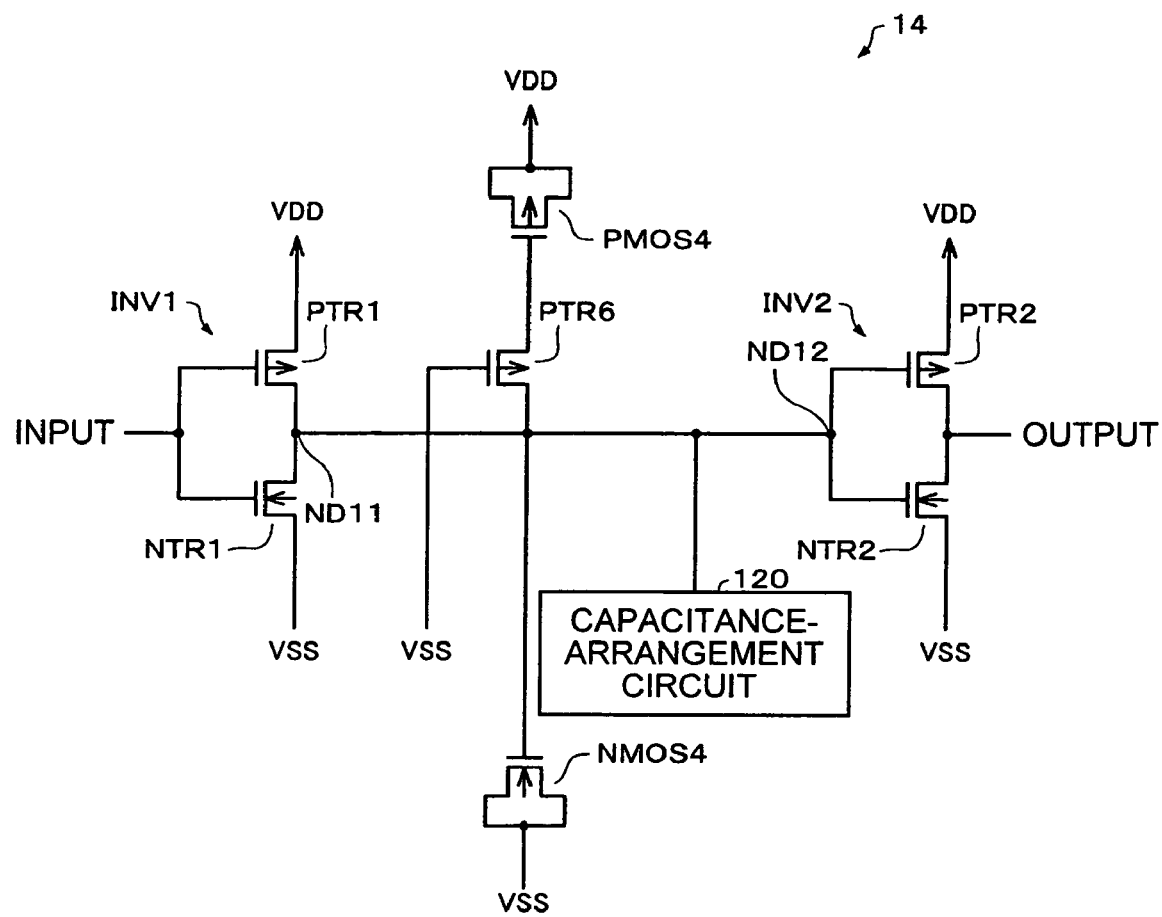
FIG. 18 is a circuit diagram showing a buffer of the modification of the second embodiment.

FIG. 18 shows a modification of the present embodiment, including a buffer 14 in which capacitive elements are further added to the buffers 12. The buffer 14 includes a transistor PTR6 and capacitive elements PMOS4 and NMOS4. The end of the transistor PTR6 is connected to a line between the node ND11 and ND12 and the other end of the transistor PTR6 is connected to the capacitive element PMOS4. In detail, the other end of the transistor PTR4 is connected to the gate of the capacitive elements PMOS4 and the source and drain thereof is connected to the first power source VDD. The gate of transistor PTR6 is connected to the second source VSS. Further, the capacitive element NMOS4 is connected to a line between the nodes ND11 and ND12. In detail, the gate of the capacitive element NMOS4 is connected to a line between the node ND11 and ND12 and the source and the drain of the capacitive element NMOS4 is connected to the second power source VSS.

Here, the capacitive element PMOS4 comprises a P type MOS transistor, the capacitive element NMOS4 comprises an N type MOS transistor, but are not limited to such transistor. The capacitive elements PMOS4 and NMOS4 may comprise other capacitive elements such as a first and second polysilicon thin films.

In this modification, the transmission circuit is provided with the buffer 14 in which capacitive elements NMOS4 and PMOS4 are installed between the nodes ND11 and ND12, instead of the buffers 12. This installation generates an eye pattern of a waveform outputting from the transmission circuit, which is geometrically diphycercal. This diphycercal waveform of an eye pattern shows stabilized signal characteristics. Therefore, a user pays attention to an importance of a shape of an eye pattern. Namely, the buffer 14 in the modification can provide a transmission circuit which meets user's need.

In the present embodiment and the first embodiment, the capacitance-arrangement circuit 100(120) is installed between the inverter IV1 and the inverter INV2. As a comparison, the capacitance-arrangement circuit 100(120) may be installed at the latter stage from the inverter INV2 instead of the above constitution. However, in this constitution, capacitance is added to the gates of the transistors SW1 and SW2. This additional capacitance deforms a given waveform outputting from the DP terminal 30 and DM terminal 40, making fast data transmission difficult. Further, the transistors SW1 and SW2 are switched with large current such as 17.78 mA defined by the USB 2.0 standard giving large influence to switching operation. Hence, this influence may largely change the characteristics of a waveform outputting from the DP terminal 30 and DM terminal 40 from that in the design stage. In order to avoid the above situation, according to the present embodiment and the first embodiment, the capacitance-arrangement circuit 100(120) is installed between the inverter IV1 and the inverter INV2.

2.3 Third Embodiment

Figure 19:
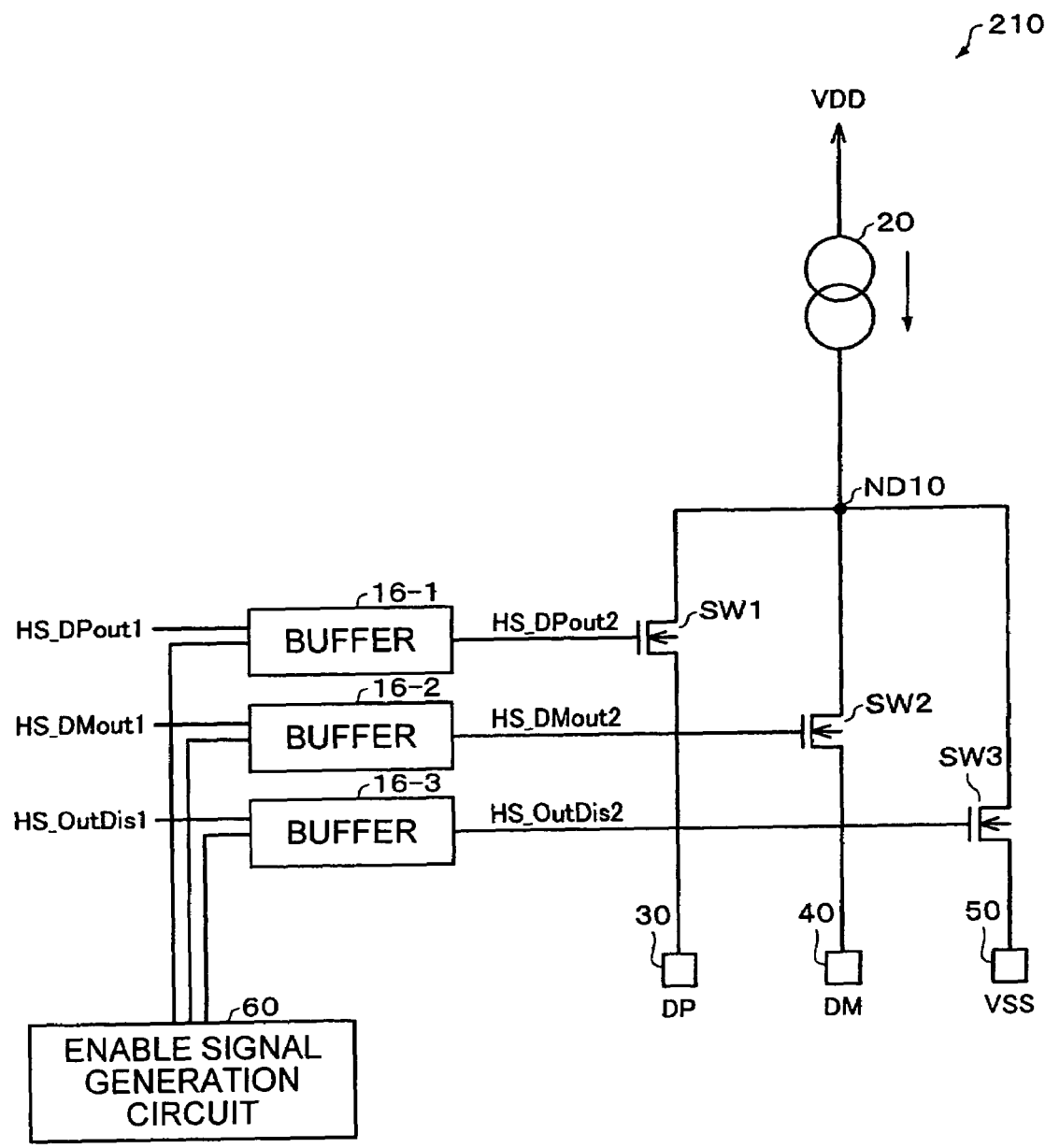
FIG. 19 is a circuit diagram showing a transmission circuit of a third embodiment.

FIG. 19 shows a transmission circuit 210 including buffers 16-1 to 16-3 in the present embodiment and an enable signal generation circuit 60. The buffers 16-1 to 16-3 are called as the buffers 16 hereafter as a generic term and connected to the enable signal generation circuit 60. Other constitutions in the embodiment are the same in the transmission circuit 200 according to the first embodiment.

Figure 20:
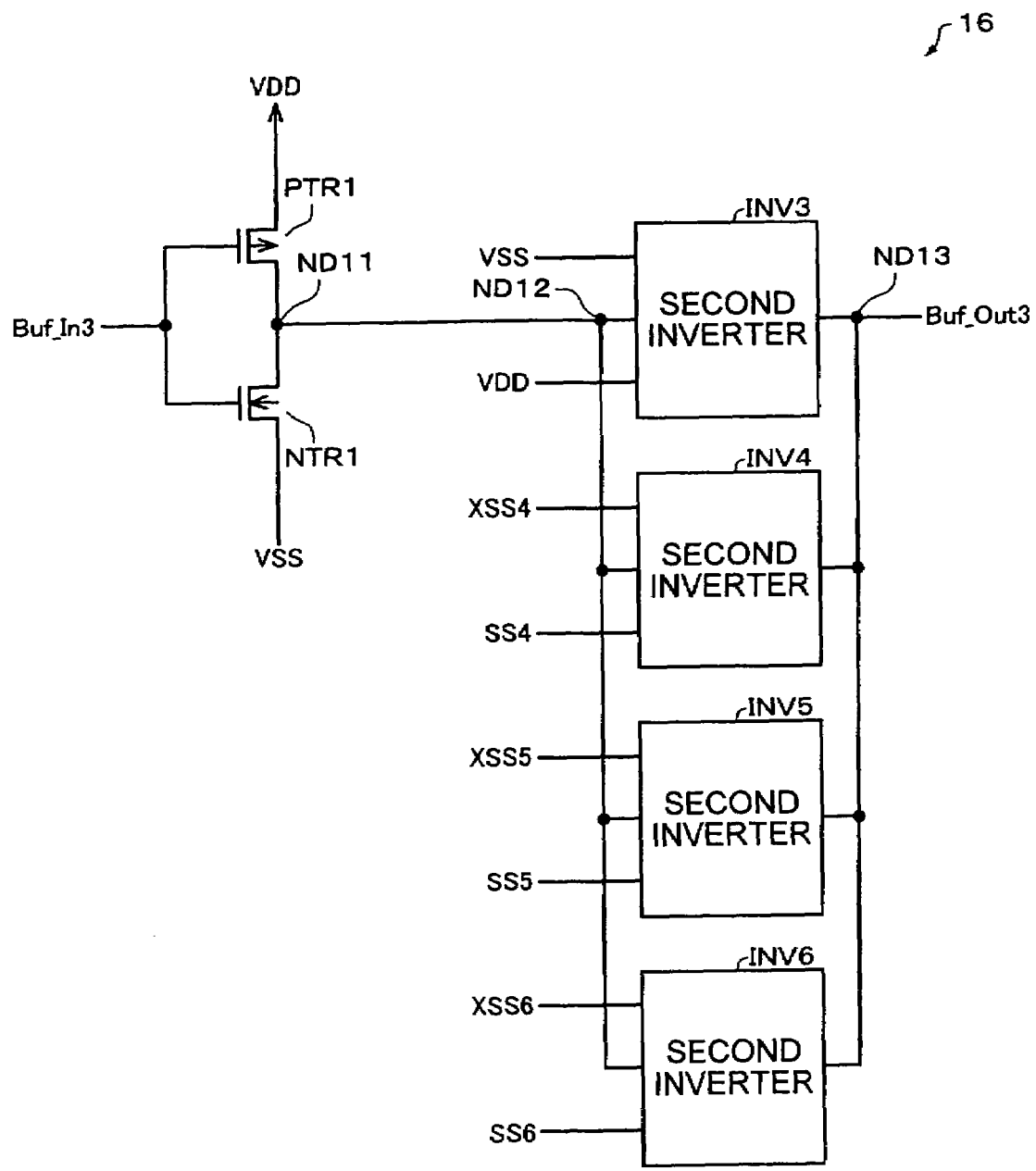
FIG. 20 is a circuit diagram showing a buffer of the third embodiment.

FIG. 20 shows the buffers 16 including the inverter INV1 (a first inverter in the broad sense) and second inverters INV3 to INV6 (a plurality of inverters in the broad sense). An output node ND11 of the inverter INV1 is connected to an input node ND12 of the inverter INV3. The inputs of the inverters INV4 to INV6 are commonly connected to the input node ND12 of the inverter INV3. The outputs of the inverters INV4 to INV6 are commonly connected to the output node of ND13 the inverter INV3. The inverters INV4 to INV6 receive enable signals SS4 to SS6 from the enable signal generation circuit 60 in FIG. 19. The inverters INV4 to INV6 also receive inversed signals XSS4 to XSS7, which are generated by inversing enable signals SS4 to SS6 from the enable signal generation circuit 60 in FIG. 19. Here, in the present embodiment, the inverter INV is always set active by connecting the first power source VDD and the second power source VSS to the terminal of the inverter NV3 which receives the enable signal and its inverted signal. But, the inverter is not limited to this connection. The inverter INV3 may also receive the enable signal from the enable signal generation circuit 60.

The inverters INV3 to INV6 are set active or non-active by the enable signals from the enable signal generation circuit 60. When the inverters INV3 to INV6 are set active, they function as an inverter. When they are set non-active, their output impedance becomes high. Here, The inverters INV3 to INV6 are arranged in parallel each other, increasing an amount of current flowing a line between the nodes ND12 and ND13, if the numbers of inverters, which are set active, are increased. Namely, an amount of current flowing a line between the nodes ND12 and ND13 can be adjusted, adjusting rising and falling of signal waveform from the output Buf_Out3 of the buffers 16.

The present embodiment is provided with four inviters INV3 to INV6, but not limited to this construction. Two or more than five inverters may be installed. The numbers of second inverters in the buffers 16 may be arbitrarily set. For example, the numbers of the second inverters of the buffers 16 are increased if the signal waveform from the output Buf_Out3 of the buffers 16 is adjusted with multiple steps.

Figure 21:
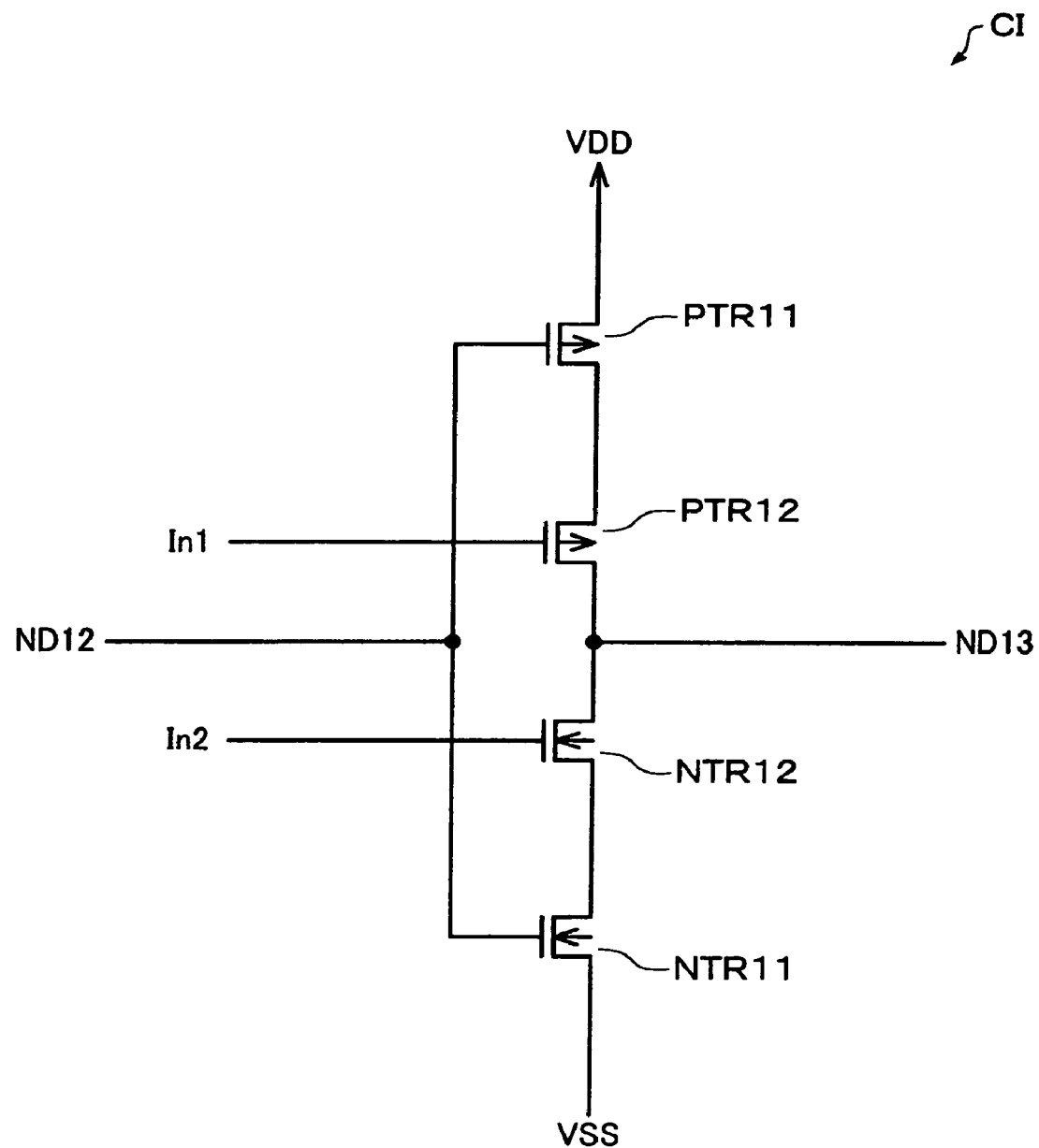
FIG. 21 is a circuit diagram showing a second inverter of the third embodiment.

FIG. 21 shows a detail circuit of the inverters INV3 to INV6. In the present embodiment, the inverters INV3 to INV6 comprise a clocked gate inverter CI, but are not limited to this. The second inverters may be an inverter which are set enable or disable by the enable signals.

The input In1 receives any of enable signals SS4 to SS6 from enable signal generation circuit 60 and output voltage from the second source VSS. The input In2 receives any of inverted signals input to the input In1. The input In1 is connected to the gate of the transistor PTR12 and the input In2 is connected to the gate of the transistor NTR12. Namely, the input In1 receives a low level signal and the input In2 receives a high level signal, making the clocked gate inverter CI function as an inverter.

In the inverters INV3 to INV6 of the present embodiment, current drive capabilities of the transistors PTR11 and PTR12 are identical to that of the transistors NTR11 and NTR 12. In detail, the ratio of a gate width to a gate length L of the transistors PTR11 and PTR12 and that of the transistors NTR 11 and NTR 12 is set to three to one. This ratio is one example and may be set to other values. Among the inverters INV3 to INV6, gate widths W of the transistors PTR11 and PTR12 are set different in order to freely set current drive capabilities of the transistors, which are set active among inverters INV3 to INV6. For example, in the inverter INV4, the ratio of a gate width W to a gate length L of the transistors PTR11 and PTR12 and that of the transistors NTR11 and NTR 12 is set to three to one. But, such ratio in the inverter INV3 is set to nine to three. Namely, the ratio of a gate width W to a gate length L of the transistors PTR11 and PTR12 in the inverter INV3 is three times of the ratio of the transistors PTR11 and PTR12 in the inverter IV4. But, the ratio of a gate width to a gate length L of the transistors PTR11 and PTR12 and that of the transistors NTR11 and NTR 12 in the inverter INV3 is identical to that in other inverters. The reason of this setting is described later.

As modification, all of the second inverters may comprise the same clocked gate inverter.

Figure 22A:
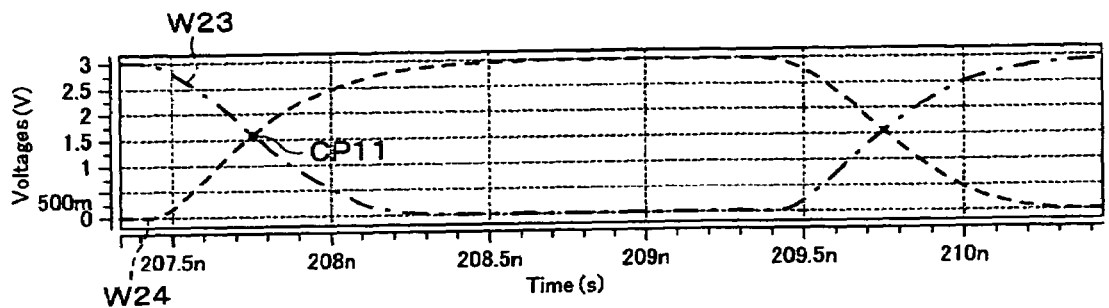
FIGS. 22A to 22D show waveforms outputting from the buffers corresponding to a enable signal generation circuit in the third embodiment.

FIGS. 22A to 22D show waveforms outputting from the buffers 16 corresponding to total numbers of inverters, which are set active. FIG. 22A show waveforms outputting from the buffers 16 corresponding to a case when the inverter INV3 is set active. A waveform W23 is a waveform outputting to the gate of the transistor SW1 in FIG. 19 and a waveform W24 is a waveform outputting to the gate of the transistor SW2 in FIG. 19 for example. A cross-point CP7 is a point in which the waveforms W23 and W24 cross each other. FIG. 22A shows that the rising gradient of the waveform W 24 is very moderate since the second inverter, which is set active, is only the inverter INV3, so that the total current drive capability of the second inverter is small.

Figure 22B:
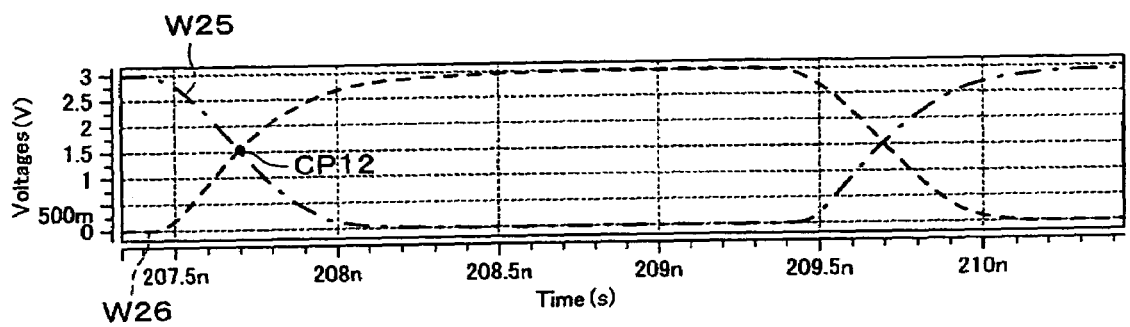

Here, waveforms W23, W25, W27 and W29 are a waveform outputting to the gate of the transistor SW1 in FIG. 19 and waveforms W24, W26, W28 and W30 are a waveform outputting to the gate of the transistor SW2 in FIG. 19 for example. Cross-points CP11 to CP14 are a point in which the waveforms W22 to W30 cross each other. FIG. 22B shows waveforms outputting from the buffers 16 corresponding to a case when the inverters INV3 and INV4 among the inverters INV3 to INV6 are set active. In the inverter INV4 of the present embodiment, the ratio of a gate width W to a gate length L of the transistors PTR11 and PTR12 and that of the transistors NTR11 and NTR 12 is set to three to one. But, such ratio is set to six to two or nine to three.

Figure 22C:
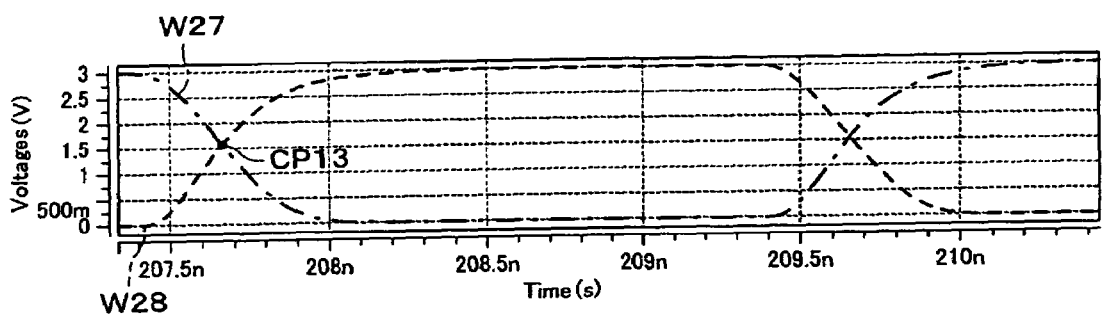

FIG. 22C shows waveforms outputting from the buffers 16 corresponding to a case when the inverters INV3, IV4 and INV5 among the inverters INV3 to INV6 are set active. The inverter INV5 of the present embodiment is substantially identical to the inverter INV4. But, the ratio of a gate width W to a gate length L of the transistors PTR11 and PTR12 and that of the transistors NTR11 and NTR 12 in the inverter INV5 may be set to six to two or nine to three.

Figure 22D:
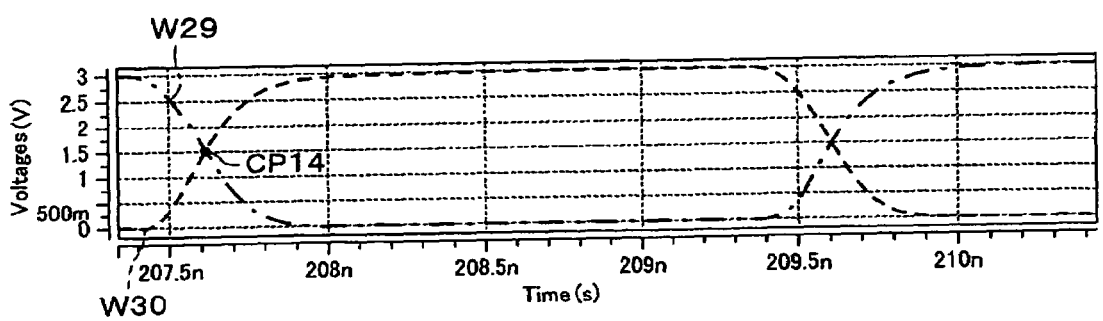

FIG. 22D shows waveforms outputting from the buffers 16 corresponding to a case when all the inverter INV3 to INV6 may be set active. In the inverter INV6 of the present embodiment, the ratio of a gate width W to a gate length L of the transistors PTR11 and PTR12 and that of the transistors NTR11 and NTR 12 is set to nine to three. But, such ratio may be set to six to two or nine to three. FIG. 22D further shows that the rising gradient of the waveform W 30 is sharper than that of W24, W26 and W28, since the second inverters, which are set active, are the four inverters INV3 to INV6, so that the total current drive capabilities of the second inverters are large. Comparing waveforms W23 to W30 in FIG. 22A to 22D shows that the rising gradient or falling gradient of these waveforms become moderate in response to the increase of total current drive capabilities of the second inverters.

When the rising gradient or falling gradient of these waveforms from the buffers 16 is sharp, the transistors SW1 and SW2 of the transmission circuit 210 switch suddenly, making the transition time from an OFF state to an ON of theses transistors become short. Hence, the gradient of rising of a signal generated at the DP terminal 30 or the DM terminal 40 becomes sharp. On the contrary, when the rising gradient or falling gradient of these waveforms from the buffers 16 is moderate, the transistors SW1 and SW2 of the transmission circuit 210 switch slowly, the rising gradient of a signal generated at the DP terminal 30 and the DM terminal 40 becomes moderate.

Figure 23:
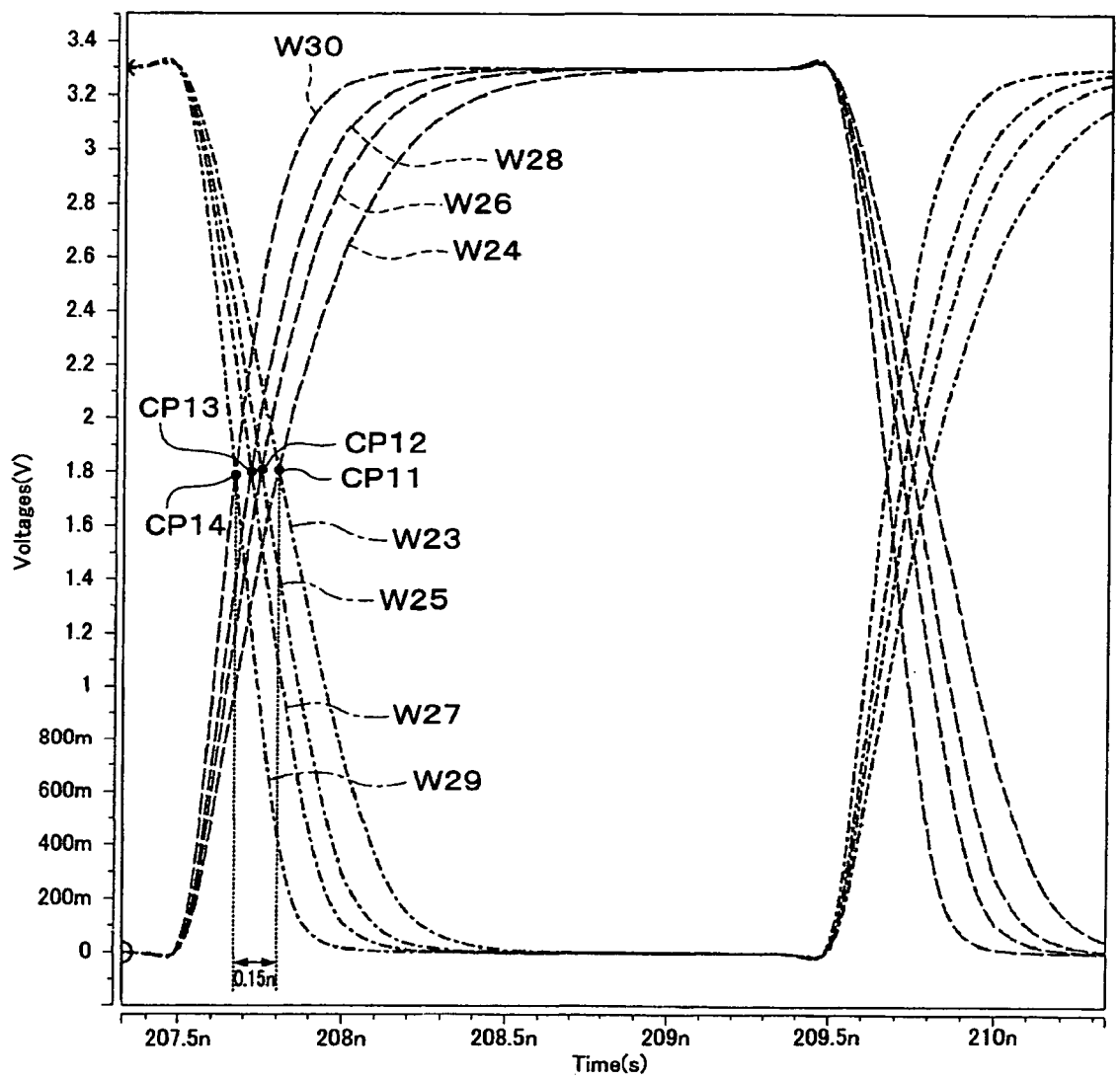
FIG. 23 shows waveforms in FIGS. 22A to 22D, which are superimposed each other.

FIG. 23 shows waveforms W23 to W30 in FIG. 22A to 22D, which are superimposed each other. FIG. 23 further shows that the potentials at the cross-points CP11 to CP14 are concentrated to around 1.6V and almost constant. If the potential at the cross-point is greatly changed, it becomes difficult to control a signal generated from the DP terminal and the DM terminal 40 at the time when one of transistors SW1 and SW2 of the transmission circuit 200 is changed to an ON state from time when both transistors are an OFF state. In order to increase reliability and stability of the transmission circuit 210, the potentials at the cross-points CP11 to CP14 are set constant in the buffers 16 of the present embodiment.

In the inverters INV3 to INV6, current drive capabilities of the transistors PTR11 and PTR12 are identical to that of the transistors NTR11 and NTR 12 as described before. This constitution is to keep potentials at the cross-points CP11 to CP14 constant.

Further, the delay time of a signal at the cross-points CP11 and CP14 is around 0.1 second and almost half of that in other embodiments in FIG. 5 or FIG. 13. The delay time of a signal in FIG. 5 and FIG. 13 is around 0.25 to 0.3 ns at maximum. This delay time in the present embodiment is caused by not installing a capacitive element between the nodes ND11 and ND12 of the buffers 16. The present embodiment can restrain the increase of the delay time even if adjusting the waveform outputting from the buffers 16, enabling the buffers 16 to output a more reliable signal waveform.

FIG. 24 to FIG. 27 show waveforms of signals outputting from the DP terminal 30 and the DM terminal 40 of the transmission circuit 200 in order to show change of waveforms of the transmission circuit.

Figure 24:
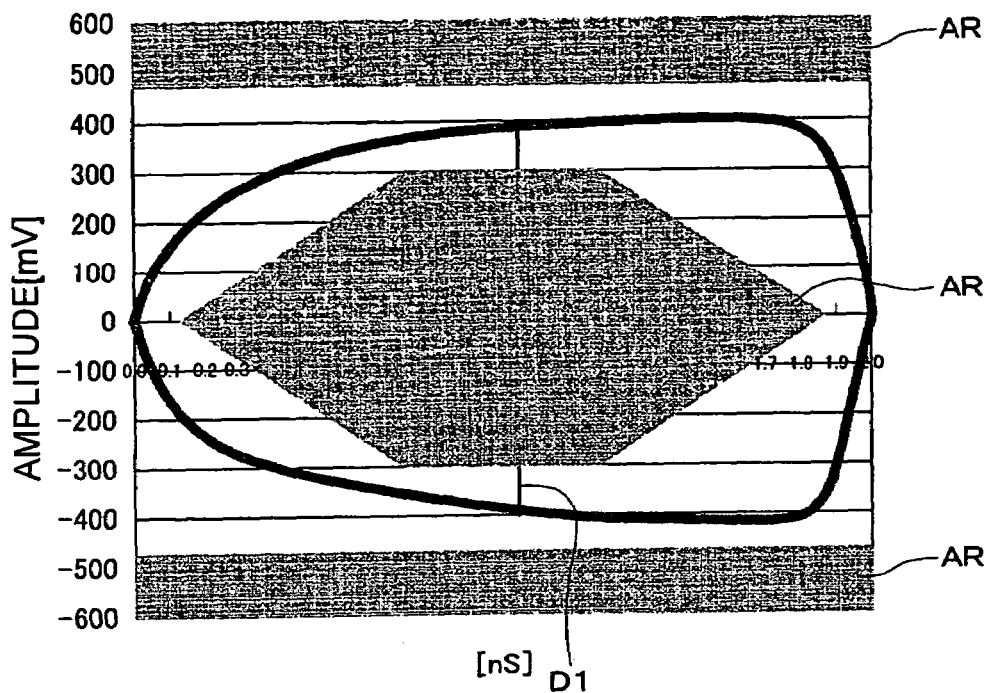
FIG. 24 shows the waveform of a signal outputting from the transmission circuit when a signal having a waveform in FIG. 22A is input to the transmission circuit.
Figure 25:
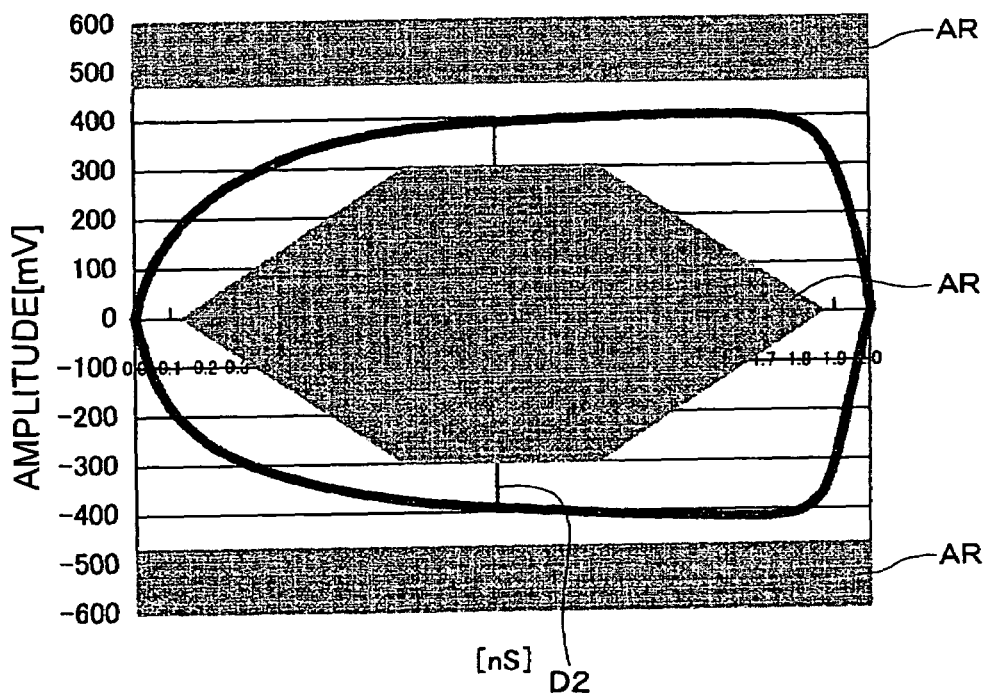
FIG. 25 shows the waveform of a signal outputting from the transmission circuit when a signal having a waveform in FIG. 22B is input to the transmission circuit.
Figure 26:
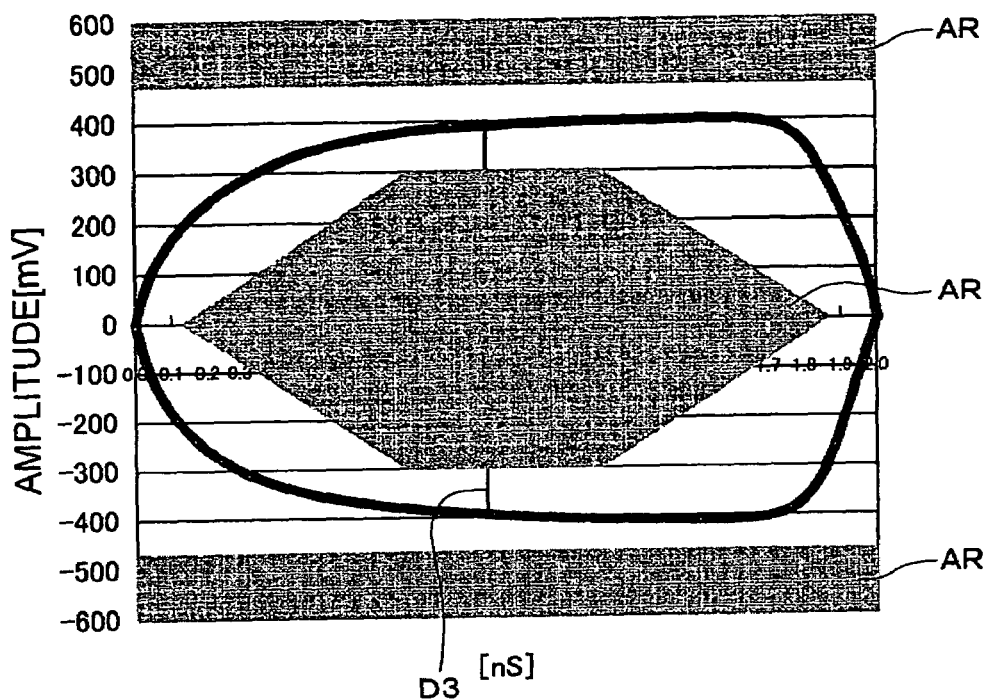
FIG. 26 shows the waveform of a signal outputting from the transmission circuit when a signal having a waveform in FIG. 22C is input to the transmission circuit.

FIG. 24 shows a waveform outputting from the DP terminal 30 and the DM terminal 40 when each of the waveforms W23 and W24 in FIG. 22A is input to each of the gates of the transistors SW1 and SW2 in FIG. 19. Similarly, FIG. 25 shows a waveform outputting from the DP terminal 30 and the DM terminal 40 when each of the waveforms W25 and W26 in FIG. 22B, each of the waveforms W27 and W28 in FIG. 22C, and each of the waveforms W29 and W30 in FIG. 22D are input to each of the gates of the transistors SW1 and SW2 in FIG. 19.

In order to meet the transmittance circuit 210 to the USB standard, the circuit should be designed not so as to superimpose the amplitude of the signal outputting from the DP terminal 30 and the DM terminal 40 onto the inhibit area AR. Reference numerals D1 to D4 in FIG. 24 to FIG. 27 indicate time when values of waveform in FIG. 24 to FIG. 27 reach the value at the maximum amplitude.

Figure 27:
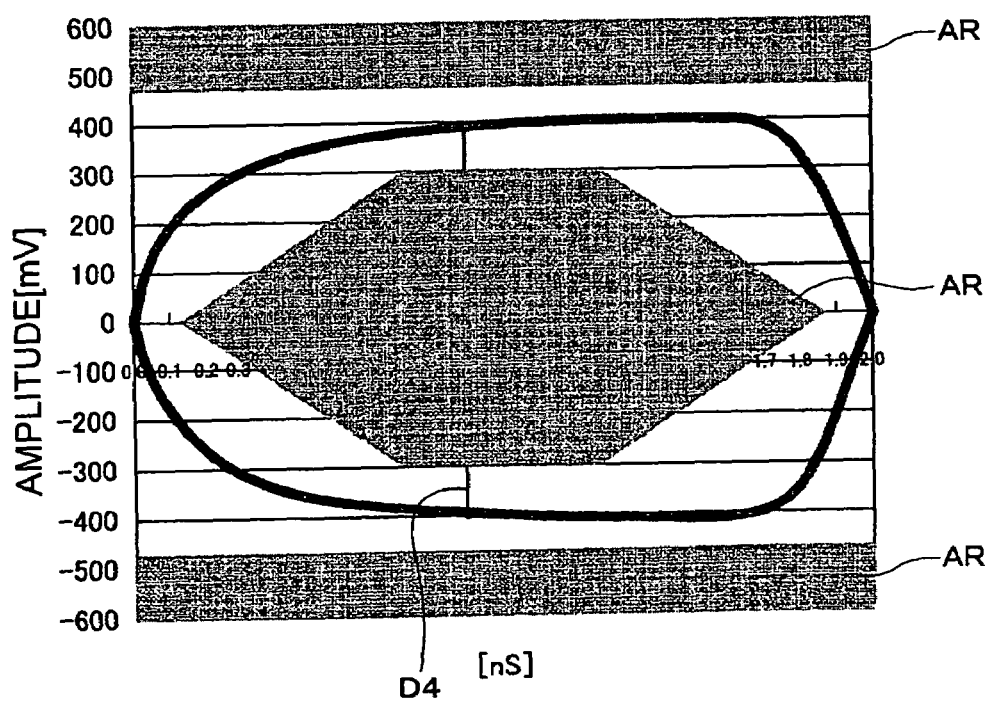
FIG. 27 shows the waveform of a signal outputting from the transmission circuit when a signal having a waveform in FIG. 22D is input to the transmission circuit.

Comparing reference numerals D1 to D4 in FIG. 24 to FIG. 27 indicates that time when values of waveforms in FIG. 24 to FIG. 27 reach the value at the maximum amplitude, is different among waveforms. A period from a cross-point of two waveforms to the time D1, shown in FIG. 24, is the longest among periods from a cross-point to reaching the maximum amplitude in FIG. 24 to FIG. 27. In other word, the rising gradient and falling gradient shown in FIG. 24 are the most moderate among gradients shown in FIG. 24 to FIG. 27. Meanwhile, a period from a cross-point of two waveforms to the time D4, shown in FIG. 27, is the shortest among periods from a cross-point to reaching the maximum amplitude in FIG. 24 to FIG. 27. In other word, the rising gradient and falling gradient shown in FIG. 27 are the sharpest among gradients shown in FIG. 24 to FIG. 27.

FIG. 22A shows a waveform outputting from the buffers 16 when the number of the second inverters set active is one. FIG. 22B to 22D show waveforms outputting from the buffers 16 when the numbers of the second inverters set active are increased as the order of FIG. 22B, 22C and 22D. Namely, the numerals D1 to D4 in FIG. 24 to FIG. 27 show a tendency of changing eye patterns in response to change of the numbers of the second inverters set active.

Accordingly, the transmission circuit 210 of the present embodiment can change the gradient of rinsing and falling of a waveform outputting from the circuit with multiple steps by adjusting the numbers of the inverters set active among the second inverters. In the present embodiment, the transmission circuit 210 can adjust an eye pattern (the rising gradient and/or the falling gradient of an output waveform, for example), transferring data accurately even if a receiving circuit in a host controller or a device controller does not strictly meet the USB standard. This advantage is equal to that oft the first embodiment.

Furthermore, the potentials at the cross-points CP11 to CP14 are kept to be constant, enabling the buffers 16 to be controlled stably. The waveform outputting from the transmission circuit 210 can be adjusted without installing a capacitive element in the buffers 16, restraining the increase of delay time.

Figure 28:
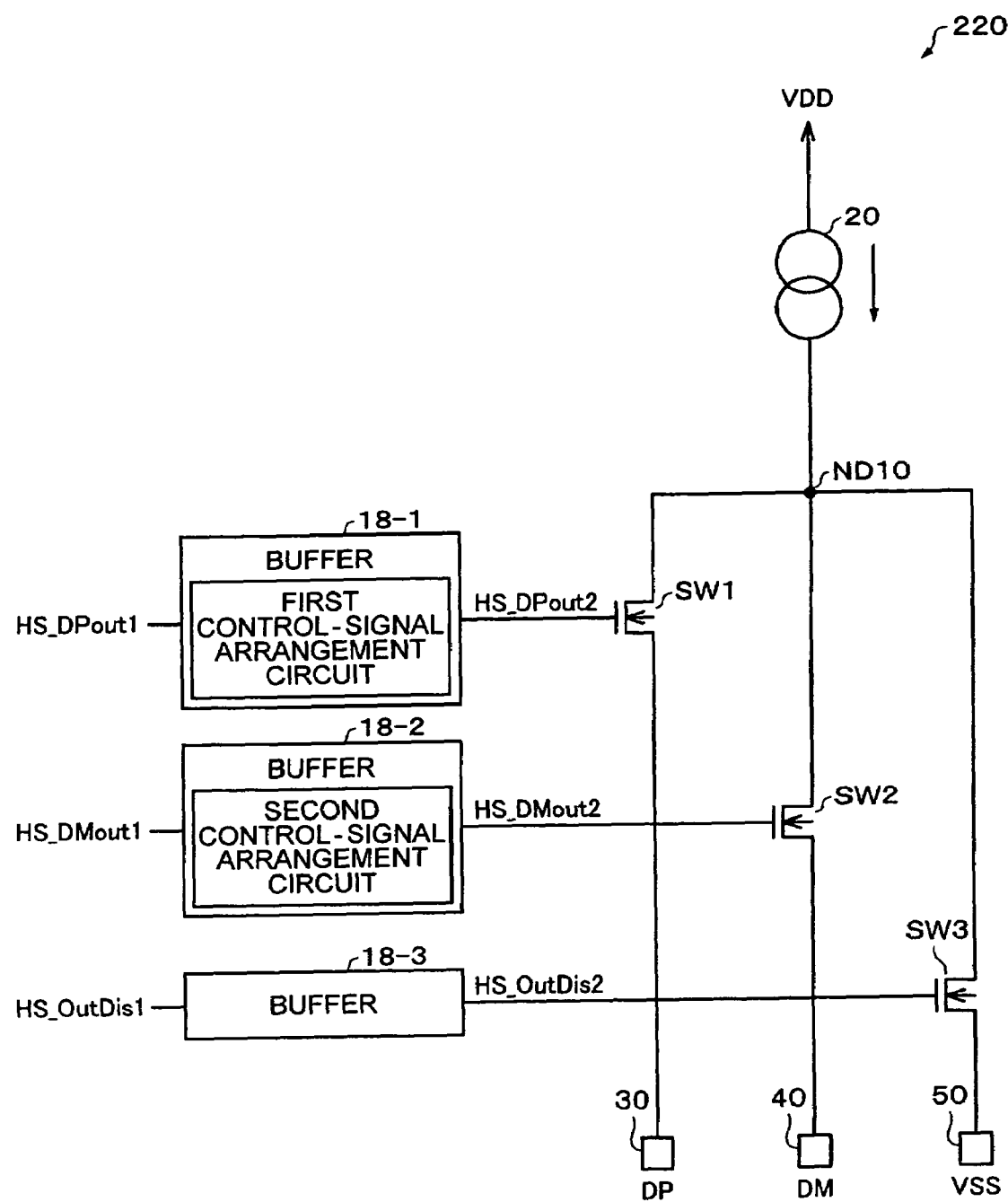
FIG. 28 is a block diagram showing a transmission circuit regarding to the other aspect of the first to third embodiments.

Further, the transmission circuit may comprise buffers 18-1 to 18-3 shown in FIG. 28 for example, instead of the buffers in the first, second and the third embodiments. The transmission circuit 220 in FIG. 28 includes the buffer 18-1 (a first buffer in the broader sense) the buffer 18-2 (a second buffer in the broader sense) and the buffer 18-3. The buffer 18-1 includes a first control-signal arrangement circuit 130 and the buffer 18-2 includes a second control-signal arrangement circuit 140. The first and second control-signal arrangement circuits 130 and 140 adjust the rising and falling gradient of signals HS_DPout1 and HS_Dmout1 and outputs signals HS_DPout2 and HS_Dmout2.

Figure 29:
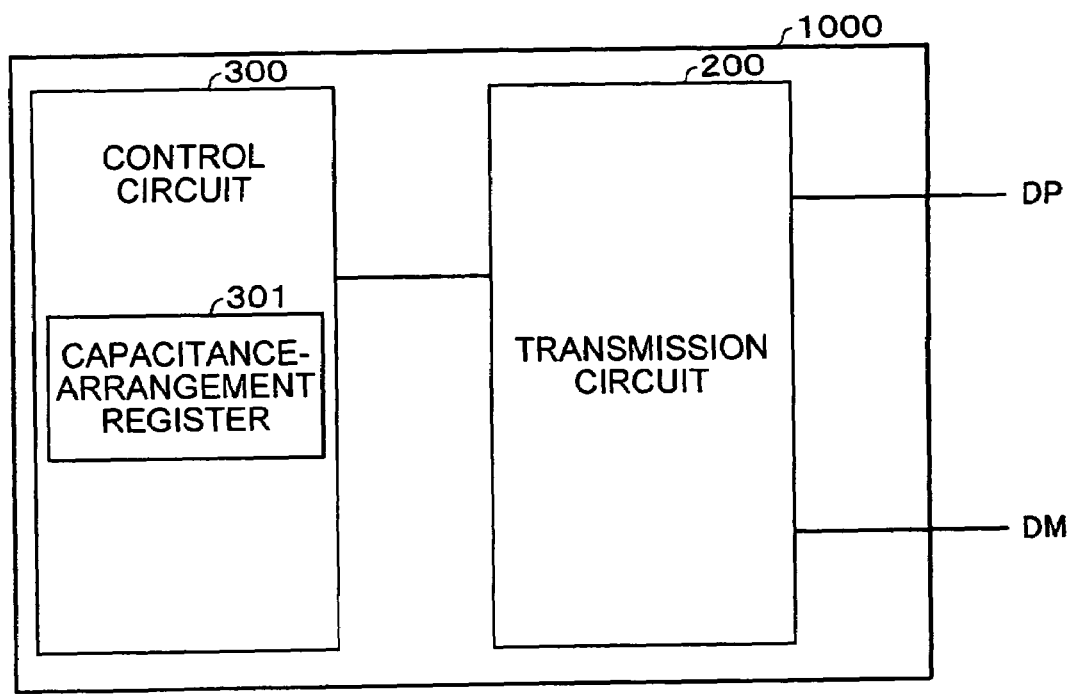
FIG. 29 is a block diagram showing a data transfer control circuit including the transmission circuit of the first to third embodiments.

3. Transmission Circuit, Data Transmission Control Device and Electronic Equipment FIG. 29 is a block diagram showing a data-transfer control device 1000 including the transmission circuit 200 and the control circuit 300 (a circuit processing a given transmission in the broader sense) in the first and the second embodiment.

The control circuit 300 includes a capacitance arrangement register 301 that stores capacitance-arrangement information for setting additional capacitance of the capacitance-arrangement circuit 100 (or 120) of the transmission circuit 200. The control circuit 300 sets additional capacitance of the capacitance-arrangement circuit 100 (or 120) based on the capacitance arrangement register 301. Installing the capacitance arrangement register 301 enables the capacitance-arrangement circuit 100 (or 120) to be controlled by a firmware. Here, the capacitance arrangement register 301 may be installed outside of the control circuit 300, in the transmission circuit 200 for example. Further, the capacitance arrangement register 301 may be omitted from the data-transfer control device 1000.

Figure 30:
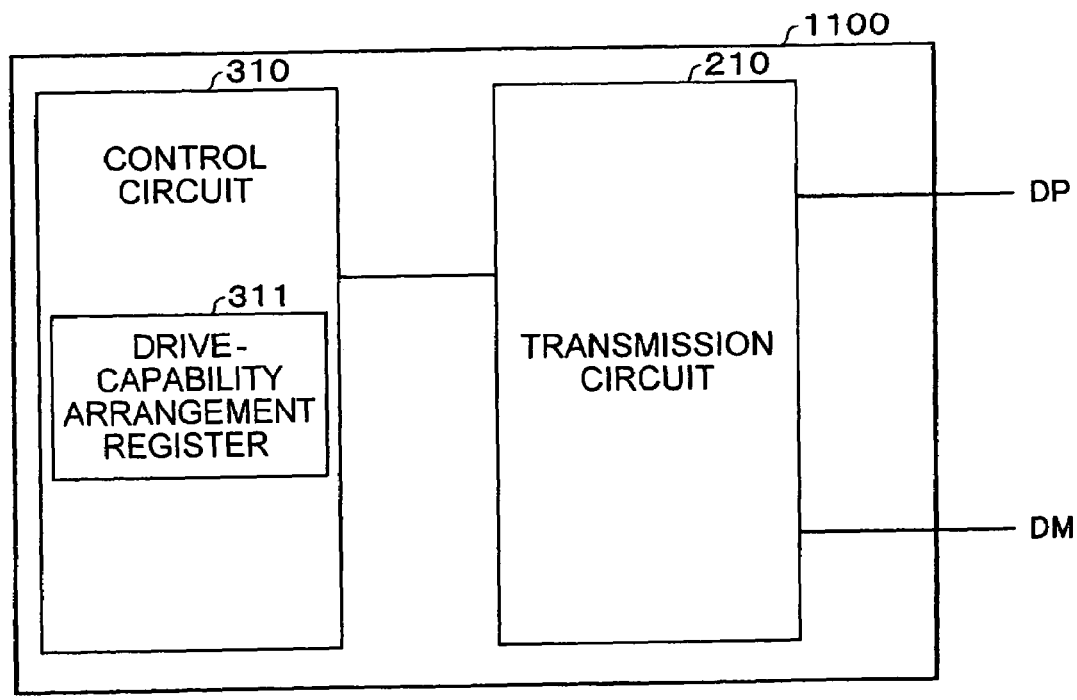
FIG. 30 is a block diagram showing the data transfer control circuit including the transmission circuit of third embodiment.

FIG. 30 is a block diagram showing a data-transfer control device 1100 including the transmission circuit 210 and the control circuit 310 (a circuit processing a given transmission in the broader sense) in the third embodiment.

The control circuit 310 includes a drive-capability arrangement register 311 that stores information of setting the second inverters INV3 to INV6 of the transmission circuit 210 (a plurality of second inverter in the broader sense) enable or disable. The control circuit 310 controls the enable signal generation circuit 60 based on the drive-capability arrangement register 311. The enable signal generation circuit 60 sets the second inverters INV3 to INV6 enable or disable based on information of setting enable or disable stored in the drive-capability arrangement register 311. Installing the drive-capability arrangement register 311 enables the enable signal generation circuit 60 to be controlled by a firmware. Here, the drive-capability arrangement register 311 may be installed outside of the control circuit 300, in the transmission circuit 210 or in the enable signal generation circuit 60 of the transmission circuit 210 for example. Further, the drive-capability arrangement register 311 may be omitted from the data-transfer control device 1100.

Using data the transfer control device 1000 or 1100 can transfer data accurately even if receiving circuits in a host controller or a device controller do not strictly meet the USB standard.

Figure 31:
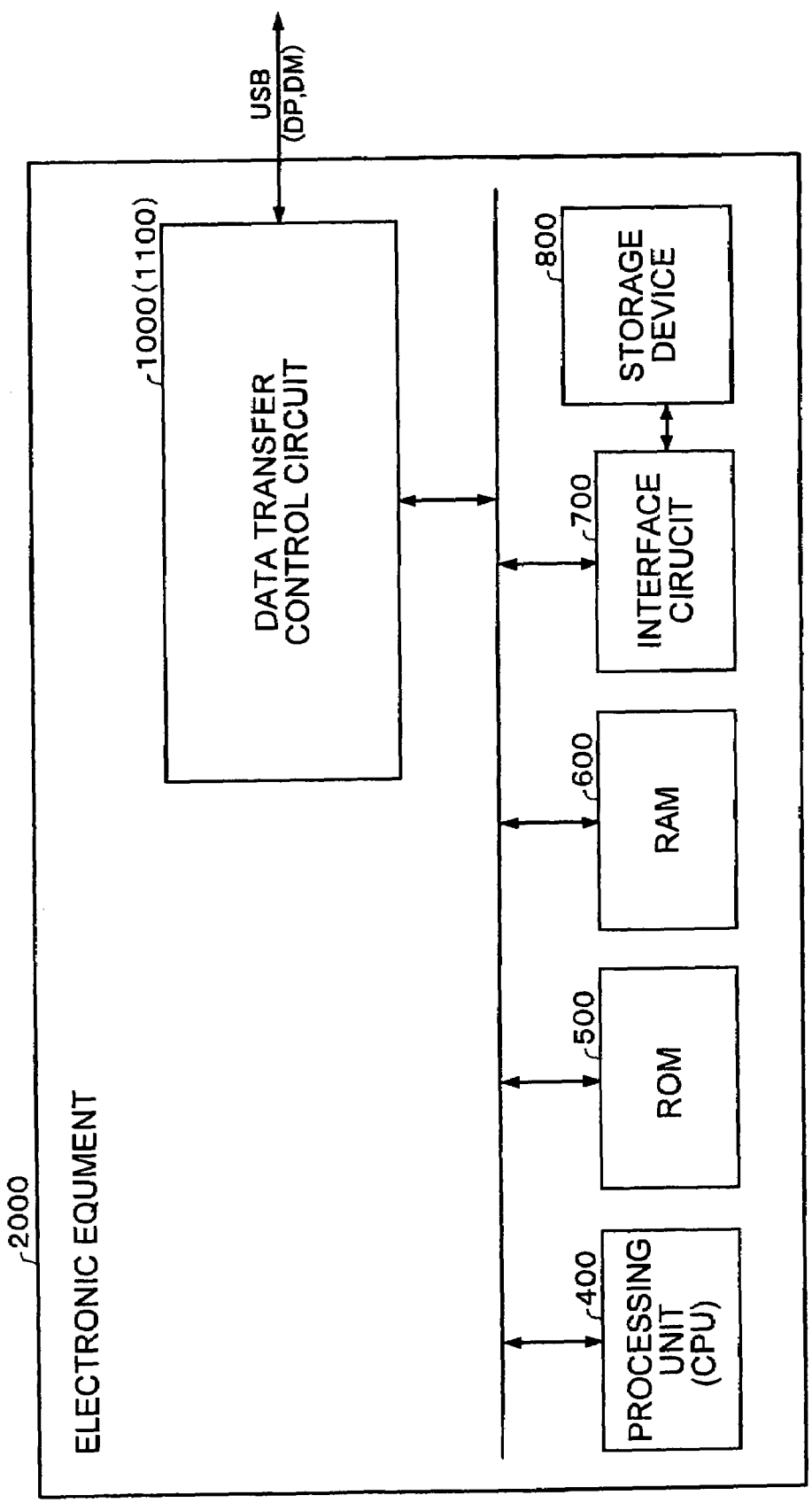
FIG. 31 shows an electronic apparatus including the data-transfer control device in FIG. 29 or the data-transfer control device in FIG. 30.

FIG. 31 shows an electronic apparatus 2000 including the data-transfer control device 1000 in FIG. 29 or the data-transfer control device 1100 in FIG. 30. The electronic apparatus 2000 includes a processing unit (such as CPU) 400, a ROM 500, a RAM 600, an interface circuit 700 and a storage device 800, but not limited to them. The interface circuit 700 and the storage device 800 may be omitted for example. The electronic apparatus 2000 in FIG. 30 may not include at least one of the processing unit (such as CPU) 400, the ROM 500, the RAM 600, the interface circuit 700 and the storage device 800, except the data-transfer control device 1000 or 1100. The data-transfer control device 1000 or 1100 of the electronic apparatus 2000 may include the transmission circuit 220 instead of the transmission circuit 200 or 210.

It should be noted that the present invention is not limited to the above-mentioned embodiments, and various changes and modifications can be made within the spirit and scope of the invention. For example, words and terms referred to as the broadest or identical sense in a part of the specification or the drawings (the first inverter, the second inverter, the first switching element, the second switching element, the first capacitive element, the second capacitive element and others) can be replaced with words and terms referred to as the broadest or identical sense in other part of the specification or the drawings (the inverter INW1, the inverter INV2, transistors NTR3 to NTR5, transistors PTR3 to PTR5, capacitive elements NMOS1 to NMOS3, capacitive elements PMOS1 to PMOS3 and others).

What is claimed is:

1. A transmission circuit transmitting deferential signals via first and second signal lines constituting a differential pair, comprising:
a current source coupled between a first power source and a given node;
a first transistor formed between the first signal line and the node;
a second transistor formed between the second signal line and the node; a first buffer outputting a first control signal to the gate of the first transistor; and
a second buffer outputting a second control signal to the gate of the second transistor, wherein
when any of the first control signal and the second control signal is set active, other of these control signals is set non-active; each of the first and second buffers includes a first inverter and a second inverter receiving an output from the first inverter; and a capacitance-arrangement circuit is installed between the first inverter and the second inverter.

2. The transmission circuit according to claim 1, wherein the capacitance-arrangement circuit includes at least a first switching element controlled by a switching signal and at least a first capacitive element;

one end of the first switching element is coupled to the output node of the first inverter and other end of the switching element is coupled to one end of the first capacitive element; and other end of the capacitive element is coupled to a second power source.

3. The transmission circuit according to claim 2, wherein:
the first switching element comprises a transistor;
the first capacitive element comprises a N type MOS transistor;
the drain of the transistor is coupled to the output node of the first inverter;
the source of the transistor is coupled to the gate of the N type MOS transistor; and
the source and drain of the N type MOS transistor are coupled to the second power source.

4. The transmission circuit according to claim 2, wherein:
a plurality of first switching elements and a plurality of capacitive elements are installed between the output node of the first inverter and the second power source;
one end of each of a plurality of first switching elements is coupled to the output node of the first inverter; and
the other end of each of a plurality of first switching elements is coupled to one end of each of a plurality of the first capacitive elements.

5. The transmission circuit according to claim 1, wherein:
the capacitance-arrangement circuit includes at least a second switching element controlled by a switching signal and at least a second capacitive element;
one end of the second switching element is coupled to the output node of the first inverter and other end of the second switching element is coupled to the end of the second capacitive element; and
other end of the second capacitive element is coupled to a first power source.

6. The transmission circuit according to claim 5, wherein:
the second switching element comprises a transistor;
the second capacitive element comprises a P type MOS transistor;
the drain of the transistor is coupled to the output node of the first inverter;
the source of the transistor is coupled to the gate of the P type MOS transistor; and
the source and drain of the P type MOS transistor are coupled to the first power source.

7. The transmission circuit according to claim 5, wherein:
a plurality of second switching elements and a plurality of second capacitive elements are installed between the output node of the first inverter and the second power source;
one end of each of a plurality of second switching elements is coupled to the output node of the first inverter; and
the other end of each of a plurality of second switching elements is coupled to one end of each of a plurality of the second capacitive elements.

8. The transmission circuit according to claim 1, wherein:
the capacitance-arrangement circuit includes a plurality of first and second switching elements controlled by a switching signal and a plurality of first and second capacitive elements;
one end of each of a plurality of the first and second switching elements is coupled to the output node of the first inverter;
the other end of each of a plurality of the first switching elements is coupled to one end of each of a plurality of the first capacitive elements; and the other end of each of a plurality of the second switching elements is coupled to one end of each of a plurality of the second capacitive elements.

9. The transmission circuit according to claim 1, wherein:
the deferential signal transmitted via the first and second signal lines is a signal regulated by the universal serial bus (USB) standard.

10. A data-transfer control device comprising:
a circuit processing a given signal transmission; and
the transmission circuit transmitting a signal based on the signal transmission processing according to claim 1.

11. An electronic device comprising:
the data-transfer control device according to claim 10; and
a unit for processing memorization, importing, exporting data transferred via the data-transfer control device and a bus.

12. A transmission circuit transmitting deferential signals via first and second signal lines constituting a differential pair, comprising:
a current source coupled between a first source and a given node;
a first transistor formed between the first signal line and the node;
a second transistor formed between the second signal line and the node;
a first buffer outputting a first control signal to the gate of the first transistor;
a second buffer outputting a second control signal to the gate of the second transistor;
an enable signal generation circuit generating at least one of enable signals, which are output to the first and second buffers; wherein:
when any of the first control signal and the second control signal is set active, other of the control signals is set non-active;
each of the first and second buffers includes a first inverter and a second inverter receiving an output from the first inverter; at least one of a plurality of the second inverters is an inverter provided with a terminal for receiving the enable signal and the inverter's operation is enabled or disabled based on an enable signal from the enable signal generation circuit; and
the each output of the plurality of the second inverters is commonly coupled to other output.

13. The transmission circuit according to claim 12, wherein:
each of a plurality of the second drivers comprises a P type MOS transistor and N type MOS transistor; and
the ratio of current drive capability of the P type transistor is identical to the ratio of current drive capability of the N type transistor among the second inverters.

14. The transmission circuit according to claim 12, wherein:
the plurality of the second inverters is an inverter provided with an enable terminal and the enable signal generation circuit selects any of the second inverters by outputting an enable signal to any of the second inverters of the plurality of the second inverters,
so as to arrange total current drive capabilities of the plurality of the second inverters depending on the numbers of the selected second inverters.

15. The transmission circuit according to claim 12, wherein:
a deferential signal transmitted via the first and second signal lines is a signal regulated by the universal serial bus (USB) standard.

16. A data-transfer control device comprising:
a circuit processing a given signal transmission; and
the transmission circuit transmitting a signal based on the signal transmission processing according to claim 12.

17. The transmission circuit according to claim 16, further comprising a drive-capability arrangement register for storing enable and disable setting information to control enable and disable status of the plurality of the second inverters.

18. A transmission circuit transmitting deferential signals via first and second signal lines constituting a differential pair, comprising:
a current source coupled between a first source and a given node;
a first transistor formed between the first signal line and the node;
a second transistor formed between the second signal line and the node;
a first buffer outputting a first control signal to the gate of the first transistor; and
a second buffer outputting a second control signal to the gate of the second transistor, wherein
the first buffer includes a first control-signal arrangement circuit that arranges rising time and falling time of the first control signal; and
the second buffer includes a second control-signal arrangement circuit that arranges rising time and failing time of the second control signal.

19. The transmission circuit according to claim 18, wherein:
the first buffer includes a first inverter and a second inverter receiving an output from the first inverter;
the first control-signal arrangement circuit arranges a signal input to the second inverter from the first inverter so as to arrange rising time and falling time of the first control signal;
the second buffer includes a third inverter and a fourth inverter receiving an output from the third inverter; and
the second control-signal arrangement circuit arranges a signal input to the fourth inverter from the third inverter so as to arrange rising time and falling time of the second control signal.

20. The transmission circuit according to claim 18, wherein:
the deferential signal transmitted via the first and second signal lines is a signal regulated by the universal serial bus (USB) standard.

21. The data-transfer control device according to claim 20, further comprising a capacitance arrangement register for storing capacitance-arrangement information to control the capacitance-arrangement circuit.

22. A data-transfer control device comprising:
a circuit processing a given signal transmission; and
the transmission circuit transmitting a signal based on the signal transmission processing according to claim 18.

* * * * *